United States Patent
Genov et al.

(10) Patent No.: US 11,184,564 B2
(45) Date of Patent: *Nov. 23, 2021

(54) METHOD AND SYSTEM FOR PIXEL-WISE IMAGING

(71) Applicant: THE GOVERNING COUNCIL OF THE UNIVERSITY OF TORONTO, Toronto (CA)

(72) Inventors: Roman Genov, Toronto (CA); Kiriakos Neoklis Kutulakos, Toronto (CA); Navid Sarhangnejad, Toronto (CA); Nikola Katic, Toronto (CA); Mian Wei, Mississauga (CA)

(73) Assignee: THE GOVERNING COUNCIL OF THE UNIVERSITY OF TORONTO, Toronto (CA)

( * ) Notice: Subject to any disclaimer, the term of this patent is extended or adjusted under 35 U.S.C. 154(b) by 117 days.

This patent is subject to a terminal disclaimer.

(21) Appl. No.: 16/226,808

(22) Filed: Dec. 20, 2018

(65) Prior Publication Data

US 2020/0204748 A1 Jun. 25, 2020
US 2021/0266479 A9 Aug. 26, 2021

Related U.S. Application Data

(63) Continuation of application No. 15/964,722, filed on Apr. 27, 2018, now Pat. No. 10,229,943.
(Continued)

(51) Int. Cl.
*H04N 5/353* (2011.01)
*H04N 13/254* (2018.01)

(52) U.S. Cl.
CPC ......... *H04N 5/3535* (2013.01); *H04N 13/254* (2018.05)

(58) Field of Classification Search
CPC ......... H01L 27/14609; H01L 27/14643; H01L 25/167; H04N 5/341; G06T 3/4015
See application file for complete search history.

(56) References Cited

U.S. PATENT DOCUMENTS

2004/0239789 A1* 12/2004 Bruce .................... H04N 5/335
348/308
2008/0007645 A1 1/2008 McCutchen
(Continued)

OTHER PUBLICATIONS

"Bidirectional Multi-Level Spatial Coded Exposure CMOS Capacitive TIA Pixel Design" Luo, Yi et al., 2016 IEEE International Conference on Electron Devices and Solid-State Circuits (EDSSC), pp. 460-463.
(Continued)

*Primary Examiner* — Gevell V Selby
(74) *Attorney, Agent, or Firm* — Bhole IP Law; Anil Bhole; Marc Lampert

(57) ABSTRACT

There is provided a method and system for pixel-wise imaging of a scene. The method including: receiving a pixel-wise pattern, the pixel-wise pattern including a masking value for each pixel in an array of pixels of an image sensor; producing an electronic signal at each pixel when such pixel is exposed to light received from the scene; and directing the electronic signal at each pixel to one or more collection nodes associated with such pixel based on the respective masking value, the one or more collection nodes each capable of integrating the received electronic signal.

23 Claims, 38 Drawing Sheets

Related U.S. Application Data

(60) Provisional application No. 62/649,763, filed on Mar. 29, 2018, provisional application No. 62/491,620, filed on Apr. 28, 2017.

(56) References Cited

U.S. PATENT DOCUMENTS

| | | | |
|---|---|---|---|
| 2011/0074995 A1 | 3/2011 | Rafferty et al. | |
| 2011/0266416 A1 | 11/2011 | Kurimoto et al. | |
| 2014/0252201 A1 | 9/2014 | Li et al. | |
| 2014/0267855 A1 | 9/2014 | Fan | |
| 2015/0279899 A1* | 10/2015 | Kim | H04N 5/3559 250/208.1 |
| 2016/0065824 A1* | 3/2016 | Geng | H04N 5/2355 348/222.1 |
| 2017/0244921 A1* | 8/2017 | Velichko | H04N 5/3597 |
| 2018/0115725 A1 | 4/2018 | Zhang et al. | |

OTHER PUBLICATIONS

Luo, Yi et al., Bidirectional Multi-Level Spatial Coded Exposure CMOS Capacitive TIA Pixel Design, 2016 IEEE International Conference on Electron Devices and Solid-State Circuits (EDSSC), pp. 460-463.

Newcombe, R.A., Fox, D., Seitz, S., 2015: DynamicFusion: Reconstruction and tracking of non-rigid scenes in real-ime. In: IEEE CVPR 2015.

Heide, F., Hullin, M.B., Gregson, J., Heidrich, W.: Low-budget Transient Imaging Using Photonic Mixer Devices. In: ACM SIGGRAPH, New York, NY, USA, ACM Request Per- missions (2013).

Shrestha, S., Heide, F., Heidrich, W., Wetzstein, G.: Computational imaging with multi- camera time-of-flight systems. n: Proc. ACM SIGGRAPH Asia, ACM (Jul. 2016) 33-11.

Kim, H., Leutenegger, S., Davison, A.J.: Real-Time 30 Reconstruction and 6-DoF Tracking with an Event Camera. In: Proc. ECCV, Cham, Springer, Cham (Oct. 2016) 349-364.

Matsuda, N., Cossairt, O., Gupta, M.: MC3D: Motion Contrast 3D Scanning. In: Proc. IEEE ICCP, IEEE (2015) 1-10.

Zhang, J., Etienne-Cummings, R., Chin, S., Xiong, T., Tran, T.: Compact all-CMOS spatiotemporal compressive sensing video camera with pixel-wise coded exposure. Opt Express 24(8) (2016) 9013-9024.

Jang, J., Yoo, Y., Kim, J., Paik, J.: Sensor-Based Auto-Focusing System Using Multi-Scale Feature Extraction and Phase Correlation Matching. In: Sensors, Multidisciplinary Digital Publishing Institute (2015) 5747-5762.

Heintzmann, R., Hanley, Q.S., Arndt-Jovin, D., Jovin, T.M.: A dual path programmable array microscope (PAM): simultaneous acquisition of conjugate and non-conjugate images. J. Microscopy 204 (2001) 119-135.

O'Toole, M., Achar, S., Narasimhan, S.G., Kutulakos, K.N.: Homogeneous codes for energy- efficient illumination and imaging. In: Proc. ACM SIGGRAPH Asia, ACM Request Per- missions (2015).

O'Toole, M., Mather, J., Kutulakos, K.N.: 3D Shape and Indirect Appearance by Structured Light Transport. IEEE T-PAMI 38(7) (2016) 1298-1312.

Hernandez, C., Vogiatzis, G., Brostow, G.J., Stenger, B., Cipolla, R.: Non-rigid Photometric Stereo with Colored Lights. In: Proc. IEEE ICCP. (2007).

Fyffe, G., Yu, X., Debevec, P.: Single-shot photometric stereo by spectral multiplexing. In: Proc. IEEE ICCP. {2011).

Van der Jeught, S., Dirckx, J.J.J.: Real-lime structured light profilometry: a review. Optics and Lasers in Engineering 87 (2016)18-31.

Gharbi, M., Chaurasia, G., Paris, S., Durand, F.: Deep joint demosaicking and denoising. Proc. ACM SIGGRAPH Asia B5{6) (Nov. 2016) 191-12.

Heide, F., Steinberger, M., Tsai, Y.T., Rout, M., Pajak, D., Reddy, D., Gallo, 0., Liu, J., Heidrich, W., Egiazarian, K., Kautz, J., Pulli, K.: FlexISP: a flexible camera image processing framework. In: Proc. ACM SIGGRAPH Asia, ACM Request Permissions (2014).

Liu, Z., Shan, Y., Zhang, Z.: Expressive expression mapping with ratio images. In: Proc. ACM SIGGRAPH, New York, New York, USA, ACM (2001) 271-276.

Davis, J., Yang, R., Wang, L.: BRDF invariant stereo using light transport constancy. In: Proc. IEEE ICCV. (2005) 436-J43 vol. 1.

Pilet, J., Strecha, C., Fua, P.: Making Background Subtraction Robust to Sudden Illumination Changes. In: Proc. ECCV, Berlin, Heidelberg, Springer, Berlin, Heidelberg (2008) 567-580.

Lange, R., Seitz, P.: Solid-state time-of-flight range camera. IEEE J. Quantum Electron. 37(3) (2001) 390-397.

Wan, G., Li, X., Agranov, G., Levoy, M., Horowitz, M.: CMOS Image Sensors With Multi- Bucket Pixels for Computational Photography. IEEE-JSSC 47(4) (Apr. 2012) 1031-1042.

Wan, G., Horowitz, M., Levoy, M.: Applications of Multi-Bucket Sensors to Computational Photography. Technical Report 2012-2, Stanford Computer Graphics Lab.

Wetzstein, G., Ihrke, I., Heidrich, W.: On Plenoptic Multiplexing and Reconstruction. Int. J. Computer Vision 101(2) Jan. 2013) 384-400.

Ratner, N., Schechner, Y.Y., Goldberg, F.: Optimal multiplexed sensing: bounds, conditions and a graph theory link. Opt Express 15(25) (Dec. 2007) 17072-17092.

Brown, C.M.: Multiplex Imaging and Random Arrays. PhD thesis, PhD Dissertation, University of Chicago (1972).

Schechner, Y.Y., Nayar, S.K., Belhumeur, P.N.: Multiplexing for optimal lighting. IEEE T-PAMI 29(8) (Jun. 2007) 1339-1354.

Ratner, N., Schechner, Y.Y.: Illumination Multiplexing within Fundamental Limits. In: 2007 IEEE Conference on Computer Vision and Pattern Recognition, IEEE (2007) 1-8.

Nonoyama, M., Sakaue, F., Sato, J.: Multiplex Image Projection Using Multi-band Projectors. In: 2013 IEEE International Conference on Computer Vision Workshops (ICCVW), IEEE (2013) 868-873.

Mitra, K., Cossairt, O.S., Veeraraghavan, A.: A Framework for Analysis of Computational Imaging Systems: Role of Signal Prior, Sensor Noise and Multiplexing. IEEE T-PAMI 36(10) (2014) 1909-1921.

Raskar, R., Agrawal, A., Tumblin, J.: Coded exposure photography: motion deblurring using fluttered shutter. In: Proc. ACM SiGGRAPH. (2006).

Wu, L., Ganesh, A., Shi, B., Matsushita, Y., Wang, Y., Ma, Y.: Robust Photometric Stereo 707 via Low-Rank Matrix Completion and Recovery. In: Proc. ACCV. (2010).

Gupta, M., Nayar, S.: Micro Phase Shifting. In: Proc. IEEE CVPR. (2012) 813-820.

Queau, Y., Mecca, R., Durou, J.D., Descombes, X.: Photometric stereo with only two images: A theoretical study and humerical resolution. Image and Vision Computing 57 (Jan. 2017) 175-191.

International Search Report and Written Opinion, PCT/CA2018/050496, dated Jul. 27, 2018.

J. Zhang, Y. Suo, C. Zhao, T.D. Tran, R. Etienne-Cummings, "CMOS Implementation of Pixel-Wise Coded Exposure Imaging for Insect-Based Sensor Node," 2015 IEEE Biomedical Circuits and Systems Conference (BioCAS), pp. 1-4, 2015.

Yi Luo ; Nan Guo, Shahriar Mirabbasi and Derek Ho, "CMOS computational pixel for binary temporal optically encoded high-speed imaging," 2016 IEEE International Conference on Electron Devices and Solid-State Circuits (EDSSC).

\* cited by examiner

METHOD AND SYSTEM FOR PIXEL-WISE IMAGING

GOVERNMENT INTEREST

This invention was made with government support under HR0011-6-2-0021 awarded by the Defense Advanced Research Projects Agency (DARPA). The government has certain rights in the invention.

TECHNICAL FIELD

The following relates generally to imaging, and more specifically, to a method and system for pixel-wise imaging.

BACKGROUND

Imaging sensors, such as those found in still-cameras and video-cameras, have a plurality of photosensitive receptors. Typically, the receptors are a Complementary Metal Oxide Semiconductor (CMOS) device. Photons of light are collected on photosites of the receptors, typically there is one photosite for each pixel. Typically, the photons are directed at the photoreceptors of the imaging sensor via one or more lenses. An electrical charge is produced in the silicon of the receptor for that photosite, where the charge is proportional to the intensity of the light received. The value of each charge is turned into a digital value by an analogue-to-digital converter.

For conventional colour imaging sensors, a quarter of the photosites record red light, another quarter record blue light, and the remaining half record green light. Typically, this filtering of light to each photosite is achieved by placing a coloured filter on each respective photosite, referred to as a Bayer filter array. Each of the colour pixels are interpolated, via a mosaic operation, with colour data in neighbouring photosites to assign a full colour value to each pixel.

Typically, when a conventional aperture is opened, all the photoreceptors receive light at the same time, which means that each pixel contributes approximately equally to the image. In other cases, there may be a rolling shutter, that successively blocks some photons from reaching the imaging sensor; thus, providing temporal scanning across the imaging sensor, either vertically or horizontally. The selectivity of the photosites coming from which set of photosites are collectively being blocked by the shutter at a certain instant.

It is therefore an object of the present invention to provide a method and system in which the conventional disadvantages are obviated or mitigated, and attainment of desirable attributes is facilitated.

SUMMARY

In an aspect, there is provided a system for pixel-wise imaging of a scene, the system comprising: an image sensor comprising an array of pixels, each pixel comprising a photosensitive receptor that produces an electronic signal when exposed to light received from the scene; a signal storage module comprising one or more collection nodes for each pixel, each collection node capable of integrating the electronic signal received by the respective photosensitive receptor; and a control logic module comprising control memory and one or more logic components, the control memory receiving a pixel-wise pattern, the pixel-wise pattern comprising a masking value for each pixel of the image sensor, and for each of the pixels, the one or more logical components directing the electronic signal to one or more of the respective collection nodes based on the respective masking value.

In a particular case, the one or more collection nodes comprises exactly two collection nodes per pixel, wherein the masking value is a one-digit binary value, and wherein a high binary value indicates directing the electronic signal to one of the collection nodes and a low binary value indicates directing the electronic signal to the other collection node.

In another case, the one or more collection nodes comprises exactly four collection nodes per pixel, wherein the masking value is a two-digit binary value, each of the four collection nodes associated with one of the two-digit binary values, and wherein the one or more logical components directs the electronic signal to the respective collection node based on the respective two-digit binary value.

In yet another case, the control memory receives a new pixel-wise pattern for every frame, and the one or more logical components direct the electronic signal based on the masking value of the new pixel-wise pattern.

In yet another case, the control memory receives a new pixel-wise pattern for every subframe, and the one or more logical components direct the electronic signal based on the masking value of the new pixel-wise pattern, each frame comprising a plurality of subframes.

In yet another case, the control memory comprises a first memory unit and a second memory unit, the second memory unit storing the pixel-wise pattern for a current subframe and the first memory unit storing the new pixel-wise pattern for an upcoming subframe.

In yet another case, the new pixel-wise pattern for the upcoming subframe is loaded into the first memory sequentially, and the pixel-wise pattern for the current subframe is loaded into the second memory simultaneously.

In yet another case, the image sensor comprises one of a pinned-photodiode, a photo-gate, a charge-coupled device, a charge injection device, or a single photon avalanche diode.

In yet another case, the logical components comprise charge transfer gates and the collection nodes comprise floating diffusion nodes.

In yet another case, the system further comprising a digitization module to digitize and output a measure of the integration at each collection node.

In yet another case, the imaging sensor is a line sensor.

In yet another case, the light received from the scene comprises temporally modulated light from a light source and the one or more collection nodes comprises exactly two collection nodes for each pixel, the system further comprising a processor to determine time-of-flight of the modulated light by measuring phase differences between the modulated light at the light source and the light received at the photosensitive receptor, the one or more logical components directing the electronic signal to one of the collection nodes during a first portion of the modulation of the modulated light and directing the electronic signal to the other collection node during a second portion of the modulation of the modulated light.

In yet another case, the predetermined path type is selected from a group consisting of a direct light path, an indirect light path, or a specular light path.

In yet another case, the one or more collection nodes comprises exactly two collection nodes for each pixel, the system further comprising a projector to project a light-pattern onto the scene, the pixel-wise pattern comprising a complementary pattern such that the one or more logical components direct the electronic signal to one of the collection nodes if the associated light received at the respective pixel approximately comprises a predetermined path type, otherwise the one or more logical components direct the electronic signal to the other collection node.

In yet another case, the one or more collection nodes comprises exactly one collection node for each pixel, the system further comprising a projector to project a light-pattern onto the scene, the pixel-wise pattern comprising a complementary pattern such that the one or more logical components direct the electronic signal to the collection node if the associated light received at the respective pixel approximately comprises a predetermined path type, otherwise the one or more logical components blocks or ignores the electronic signal, the predetermined path type is selected from a group consisting of a direct light path, an indirect light path, or a specular light path.

In yet another case, the light received from the scene comprises photometric stereo light illumination conditions from a light source and the one or more collection nodes comprises exactly two collection nodes for each pixel, the one or more logical components directing the electronic signal to one of the collection nodes during a first illumination condition and directing the electronic signal to the other collection node during a second illumination condition, the system further comprising a processor to determine normals of one or more objects in the scene via determining intensity of light received at each pixel.

In yet another case, the normals are determined using intensity demosaicing of two or more neighboring pixels.

In yet another case, the normals are determined using demosaicing with a ratio of each pixel's collection nodes for two or more neighboring pixels.

In yet another case, the light received from the scene comprises structured light illumination conditions from a light source and the one or more collection nodes comprises exactly two collection nodes for each pixel, the one or more logical components directing the electronic signal to one of the collection nodes during a first illumination condition and directing the electronic signal to the other collection node during a second illumination condition, the system further comprising a processor to determine depth to one or more objects in the scene from intensity of light received at each pixel via triangulation with pixels at the light source and pixels at the image sensor.

In yet another case, the depths are determined using intensity demosaicing of two or more neighboring pixels.

In yet another case, the depths are determined using demosaicing with a ratio of each pixel's collection nodes for two or more neighboring pixels.

In another aspect, there is provided a method for pixel-wise imaging of a scene, the method comprising: receiving a pixel-wise pattern, the pixel-wise pattern comprising a masking value for each pixel in an array of pixels of an image sensor; producing an electronic signal at each pixel when such pixel is exposed to light received from the scene; and directing the electronic signal at each pixel to one or more collection nodes associated with such pixel based on the respective masking value, the one or more collection nodes each capable of integrating the received electronic signal.

In a particular case, the one or more collection nodes comprises exactly two collection nodes per pixel, wherein the masking value is a one-digit binary value, and wherein a high binary value indicates directing the electronic signal to one of the collection nodes and a low binary value indicates directing the electronic signal to the other collection node.

In another case, the one or more collection nodes comprises exactly four collection nodes per pixel, wherein the masking value is a two-digit binary value, each of the four collection nodes associated with one of the two-digit binary values, and wherein the electronic signal is directed to the respective collection node based on the respective two-digit binary value.

In yet another case, a new pixel-wise pattern is received for every frame, and the the electronic signal is directed based on the masking value of the new pixel-wise pattern.

In yet another case, a new pixel-wise pattern is received for every subframe, and the electronic signal is directed based on the masking value of the new pixel-wise pattern, each frame comprising a plurality of subframes.

In yet another case, the method further comprising storing the pixel-wise pattern for a current subframe and storing the new pixel-wise pattern for an upcoming subframe separately.

In yet another case, the new pixel-wise pattern for the upcoming subframe is loaded into memory sequentially, and the pixel-wise pattern for the current subframe is loaded into memory simultaneously.

In yet another case, the method further comprising digitizing and outputting a measure of the integration at each collection node.

In yet another case, the light received from the scene comprises temporally modulated light and the one or more collection nodes comprises exactly two collection nodes for each pixel, the method further comprising determining time-of-flight of the modulated light by measuring phase differences between the modulated light at the light source and the received light, and wherein directing the electronic signal at each pixel comprises directing the electronic signal to one of the collection nodes during a first portion of the modulation of the modulated light and directing the electronic signal to the other collection node during a second portion of the modulation of the modulated light.

In yet another case, the one or more collection nodes comprises exactly two collection nodes for each pixel, the method further comprising projecting a light-pattern onto the scene, the pixel-wise pattern comprising a complementary pattern such that the electronic signal is directed to one of the collection nodes if the associated light received at the respective pixel approximately comprises a predetermined path type, otherwise the electronic signal is directed to the other collection node.

In yet another case, the predetermined path type is selected from a group consisting of a direct light path, an indirect light path, or a specular light path.

In yet another case, the one or more collection nodes comprises exactly one collection node for each pixel, the method further comprising projecting a light-pattern onto the scene, the pixel-wise pattern comprising a complementary pattern such that the electronic signal is directed to the collection node if the associated light received at the respective pixel approximately comprises a predetermined path type, otherwise the electronic signal is blocked or ignored, the predetermined path type is selected from a group consisting of a direct light path, an indirect light path, or a specular light path.

In yet another case, the light received from the scene comprises photometric stereo light illumination conditions and the one or more collection nodes comprises exactly two collection nodes for each pixel, the electronic signal is directed to one of the collection nodes during a first illumination condition and the electronic signal is directed to the other collection node during a second illumination condition, the method further comprising determining normals of one or more objects in the scene via determining intensity of light received at each pixel.

In yet another case, the normals are determined using intensity demosaicing of two or more neighboring pixels.

In yet another case, the normals are determined using demosaicing with a ratio of each pixel's collection nodes for two or more neighboring pixels In yet another case, the light received from the scene comprises structured light illumination conditions and the one or more collection nodes comprises exactly two collection nodes for each pixel, the electronic signal is directed to one of the collection nodes during a first illumination condition and the electronic signal is directed to the other collection node during a second illumination condition, the method further comprising determining depth to one or more objects in the scene from intensity of light received at each pixel via triangulation with pixels at the light source and pixels at the image sensor.

In yet another case, the depths are determined using intensity demosaicing of two or more neighboring pixels.

In yet another case, the depths are determined using demosaicing with a ratio of each pixel's collection nodes for two or more neighboring pixels.

These and other embodiments are contemplated and described herein. It will be appreciated that the foregoing summary sets out representative aspects of systems and methods to assist skilled readers in understanding the following detailed description.

BRIEF DESCRIPTION OF THE DRAWINGS

The features of the invention will become more apparent in the following detailed description in which reference is made to the appended drawings wherein.

DETAILED DESCRIPTION

Figure 1:
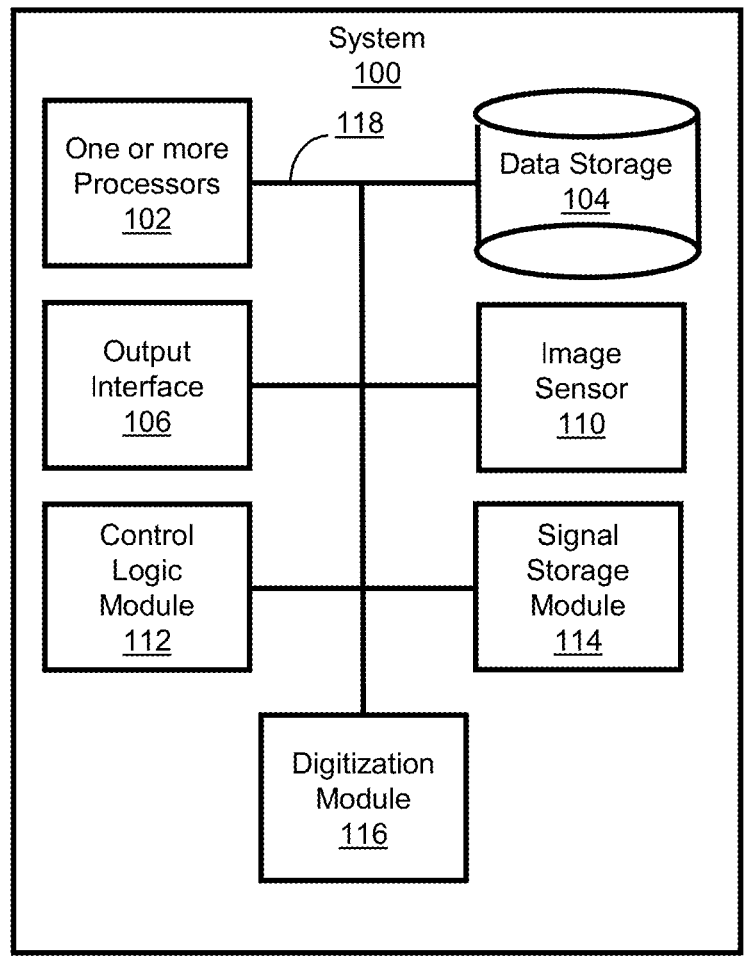
FIG. 1 is a schematic diagram of a system for pixel-wise imaging of a scene, in accordance with an embodiment.

Embodiments will now be described with reference to the figures. For simplicity and clarity of illustration, where considered appropriate, reference numerals may be repeated among the Figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, well-known methods, procedures and components have not been described in detail so as not to obscure the embodiments described herein. Also, the description is not to be considered as limiting the scope of the embodiments described herein.

Various terms used throughout the present description may be read and understood as follows, unless the context indicates otherwise: "or" as used throughout is inclusive, as though written "and/or"; singular articles and pronouns as used throughout include their plural forms, and vice versa; similarly, gendered pronouns include their counterpart pronouns so that pronouns should not be understood as limiting anything described herein to use, implementation, performance, etc. by a single gender; "exemplary" should be understood as "illustrative" or "exemplifying" and not necessarily as "preferred" over other embodiments. Further definitions for terms may be set out herein; these may apply to prior and subsequent instances of those terms, as will be understood from a reading of the present description.

Any module, unit, component, server, computer, terminal, engine or device exemplified herein that executes instructions may include or otherwise have access to computer readable media such as storage media, computer storage media, or data storage devices (removable and/or non-removable) such as, for example, magnetic disks, optical disks, or tape. Computer storage media may include volatile and non-volatile, removable and non-removable media implemented in any method or technology for storage of information, such as computer readable instructions, data structures, program modules, or other data. Examples of computer storage media include RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information, and which can be accessed by an application, module, or both. Any such computer storage media may be part of the device or accessible or connectable thereto. Further, unless the context clearly indicates otherwise, any processor or controller set out herein may be implemented as a singular processor or as a plurality of processors. The plurality of processors may be arrayed or distributed, and any processing function referred to herein may be carried out by one or by a plurality of processors, even though a single processor may be exemplified. Any method, application or module herein described may be implemented using computer readable/executable instructions that may be stored or otherwise held by such computer readable media and executed by the one or more processors.

The following relates generally to imaging, and more specifically, to a method and system for pixel-wise imaging.

"Pixel-wise", as used herein, generally refers to operations or functions on a per-pixel or pixel-by-pixel basis; however, it is understood that in some cases, pixel-wise can include operations or functions on a small-group-of-pixels by small-group-of-pixels basis.

Embodiments of the present disclosure apply to, at least, intensity-based imaging, visible light or infra-red imaging, spectral imaging, impulse-based and continuous-wave time-of-flight imaging, polarized imaging, structured light imaging, depth sensing or any other types of scanning, and two-dimensional and three-dimensional imaging applications with or without active illumination.

When an image is captured under controlled lighting, the power of the light source is an important factor: all things being equal, brighter sources will generally send more photons to an imaging sensor during an exposure, which can produce a brighter and less noisy image. However, brightness of the light source is just one way to control the quantity of light that reaches the imaging sensor. Some approaches use various devices to transport light from a light source to a captured scene, or from the scene to the imaging sensor. These devices can be programmable, for example, digital micro-mirror devices, liquid crystal panels, phase modulators, or the like. In these cases, it is often desirable to program a spatio-temporal behavior of these devices to maximize energy efficiency for a given imaging task, power, and/or exposure time. These concerns are especially relevant for live imaging, where short exposures and low-power restrictions leave little room for wasting light. The influence of signal-to-noise ratio (SNR) on range and acquisition speed can severely limit practical applications of computational imaging and illumination methods.

Additionally, light propagation through a scene is generally a complex phenomenon; for example, light reflects and refracts, light undergoes diffuse and specular inter-reflections, light scatters volumetrically, light creates caustics, and the like. Light may do all of the above before reaching an imaging sensor. These transport events, broadly referred to as global or indirect light transport, generally dominate, or contribute significantly, to the appearance of objects and scenes in the world around us because such objects have opaque, refractive or translucent aspects. In view of the above complex phenomena of light, conventionally, analyzing global light transport is extremely challenging. Advantageously, embodiments of the present disclosure provide pixel-wise programmable-exposure imaging to deal with these phenomena.

A particular type of camera that can detect direct vs. indirect incoming light, called a transport-aware camera, generally uses a programmable light source and a programmable sensor mask. Such a camera can be used for various applications; for example, 3D sensing, visual recognition, gesture analysis, robotic navigation, industrial inspection, medical/scientific imaging, and the like. Generally, transport-aware cameras require a large mechanically deforming digital micro-mirror device (DMD) to implement programmable sensor masking. This approach can have several disadvantages; for example, excessive form factor, prohibitive distortion due to DMD-imposed large-lens curvature, low electro-mechanical mask update speed significantly limiting the range of applications, high power dissipation hindering mobile implementations, and high cost.

Embodiments described herein provide a class of optical image sensors (or imagers), image sensing systems, and methods for image sensing that advantageously have pixel-wise programmable exposure during one frame time. Unlike other image sensors, where each pixel records approximately all incident light during an exposure time, pixel-wise programmable exposure imagers (PPEI) can be programmed to collect and sort the incident light on each individual pixel to one, two or multiple outputs at arbitrary intervals during one frame time.

As an example, as described herein, image sensors of the present embodiments can be advantageously used for detecting direct and in-direct light in transport-aware imaging techniques. The image sensors of the present embodiments can also be used for other applications; for example, intensity-based imaging, visible light or infra-red imaging, spectral imaging, impulse-based and continuous-wave time-of-flight imaging, polarized imaging, structured light imaging, depth sensing, other types of 2D and 3D imaging applications with or without active illumination, or the like.

In certain embodiments described herein, certain components of light transport can be selected, for example, direct-only contributions, indirect-only contributions, specular indirect contributions, or the like, by dismissing "undesirable" light paths so that they cannot contribute to an image formed on an imaging sensor. In an embodiment, this can be achieved by synchronously controlling light both at its source (for example, a projector) and its destination (at the imaging sensor) within one subframe, or frame, time period. To acquire one image, a whole sequence of 'N' arbitrarily programmable patterns are projected onto a scene of one or more objects. In an exemplary embodiment, up to 1000 mask patterns per 30 Hz video frame. During the projection, the imaging sensor integrates light over 'N' "sub-frames". At the same time, a second sequence of 'N' patterns, derived from the first patterns and applied in lockstep, controls an arbitrarily programmable pixel mask (as described herein) that, in some cases, prevents light from registering at pixels that are affected by the mask, or in other cases, directs light into another bucket. Thus, in this example, an overall imaging behavior, being a set of direct and/or indirect paths, can be determined by a precise sequence of projector patterns and sensor masks.

Practical realization of transport-aware imaging generally requires pixel-wise control over precisely which light paths are received, and which are blocked, at the imaging sensor. Advantageously, the present embodiments provide a system and method for performing arbitrarily pixel-wise time-programmable exposure, in for example transport-aware imaging, without the need for mechanical-based devices.

Referring now to FIG. 1, a system 100 for pixel-wise imaging, in accordance with an embodiment, is shown. As understood by a person skilled in the art, in some cases, some components of the system 100 can be executed on separate hardware implementations. In other cases, some components of the system 100 can be implemented on one or more general purpose processors that may be locally or remotely distributed.

FIG. 1 shows various physical and logical components of an embodiment of the system 100. As shown, the system 100 has a number of physical and logical components, including one or more processors 102, data storage 104, an output interface 106, an image sensor 110, a control module 112, a signal storage module 114, a digitization module 116 and a local bus 118 enabling the components to communicate each other. In an embodiment, the control module 112 can be executed on the one or more processors. In other embodiments, the control module 112 can be implemented in hardware or via a dedicated processor.

The output interface 106 enables another electronic device or computing device to transmit data (such as mask data) or receive the outputs from the system 100, as described herein. On some embodiments, the output interface 106 enables a user interface 106 to view such outputs, via for example, a display or monitor. In some cases, the outputs from the system 100 can also be stored in the data storage 104. In an example, the system 100 can be used for transport-aware imaging, where the image sensor 110 can use arbitrary pixel masking to select desirable light paths. In some cases, this masking can take different shapes and can change many times during a single image frame exposure.

Figure 2A:
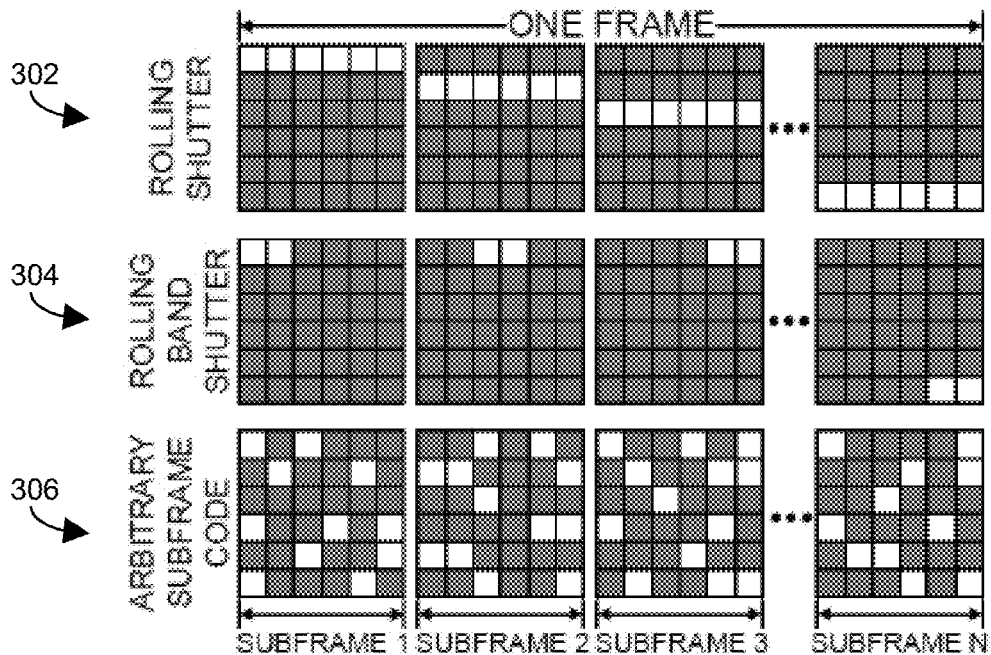
FIG. 2A is an example of the system of FIG. 1 of 1-bit coded exposure imaging masks applied over multiple subframes.

FIG. 2A shows examples of pixel masking for illustrative purposes for a plurality of in successive sub-frames in a single frame. In a first example 302, a rolling masking in illustrated where, in successive sub-frames, only one horizontal line of pixels is registering light; mimicking a traditional rolling shutter apparatus. In a second example 304, a rolling band masking is shown where, in successive sub-frames, only a grouping of pixels is registering light; this grouping being less than a whole line of pixels. In a third example 306, an arbitrary masking is applied. "Arbitrary" in this case means registering light at any arrangement or combination of one or more pixels in the imaging sensor 110; such pixels not necessarily neighbouring each other. This arrangement can be changed from one subframe to the next.

Figure 2B:
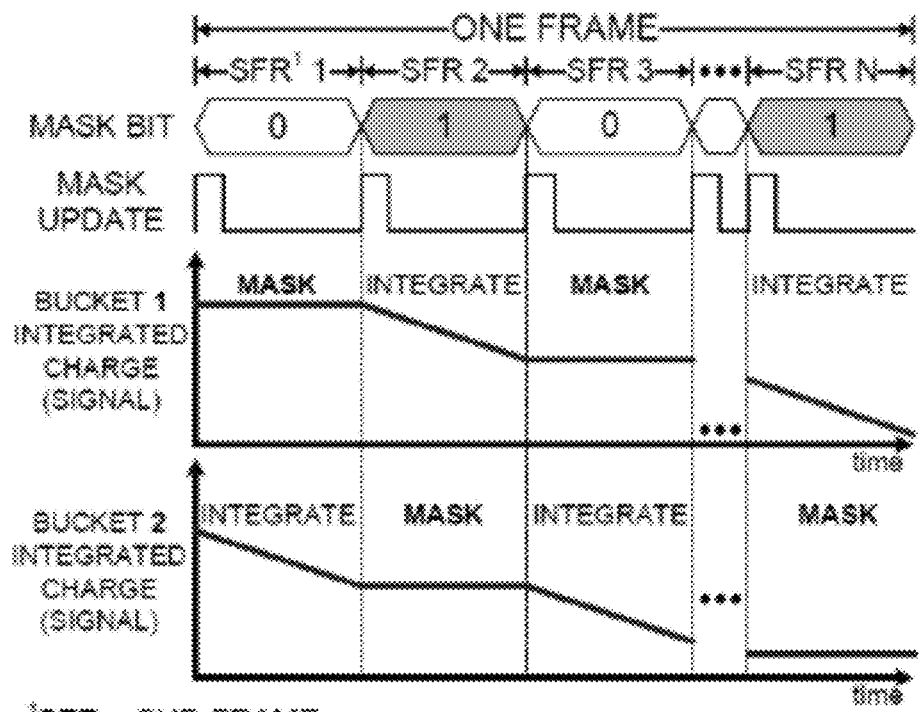
FIG. 2B is an exemplary pixel timing diagram for the system of FIG. 1 with signal integration that depends on a masking bit value over multiple subframes.

Accordingly, the system 100 can individually select which pixels are to be masked. In an embodiment, when a pixel is "masked," a first signal collection node in the signal storage module 114, associated with that pixel, herein referred to as a first "bucket", does not integrate (collect) a signal from that respective pixel. In some cases, instead, a second signal collection node (an alternative bucket or second bucket) in the signal storage module 114, associated with that pixel, integrates the charge from that signal. This allows the system 100 to implement masking without losing any of the received photons, and thus allows the system 100 to be more efficient. In some cases, the "complementary" signal which is collected by the second bucket may be used in various computational imaging applications. Conversely, when a pixel is "exposed" and does not have masking applied, the first bucket collects the signal from the respective pixel and the second bucket will not receive the signal. FIG. 2B shows an exemplary illustration of this approach. When a masking bit, associated with a particular pixel, in the control logic module is '0', the photons received at the pixel are integrated in a second bucket. Conversely, when the masking bit is 1, the photons received at the pixel are integrated in a first bucket. In this case, the masking bit can be changed for every sub-frame.

Figure 3:
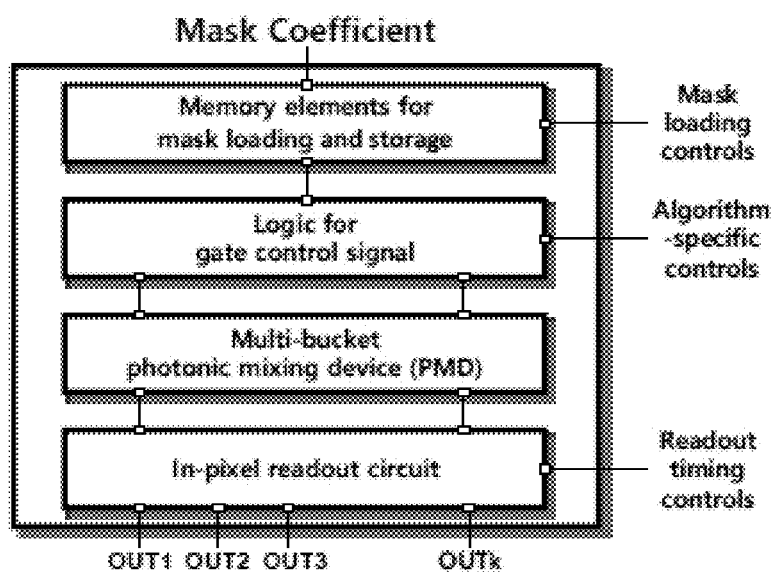
FIG. 3 is an exemplary embodiment of a control logic module for the system of FIG. 1 for one pixel.

FIG. 3 illustrates an exemplary embodiment of control logic module 112. In order to load, store and apply pixel-wise masks, in-pixel memory can be used. FIG. 3 depicts an exemplary diagram of one embodiment of a pixel where memory needed for sorting the pixel masks is provided or embedded with the pixel. In some cases, logic circuits can also be included to control signal "sorting" into one or more buckets based on mask values. The sorting of the signal (electrons) into one or more buckets for the light received by the pixel in the sensor can be performed by the control logic module 112, acting as a multi-bucket photonic mixing device (PMD), by selecting an appropriate bucket based on the respective mask value. The system 100 can have one or more ('k') buckets, and therefore 'k' different pixel outputs (readouts) for the output interface 106 or data storage 104.

Figure 4:
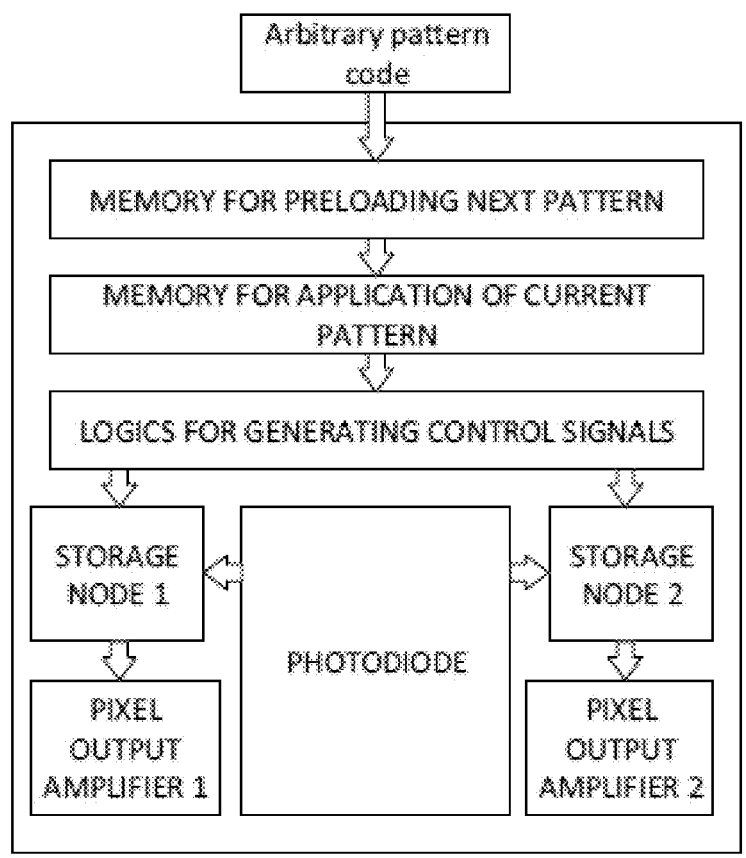
FIG. 4 is an exemplary flow diagram for a two-bucket implementation of the system of FIG. 1 for one pixel.

A particular embodiment of the system 100 is one in where there are two buckets per pixel in the signal storage module 114. In this embodiment, the signal received by each pixel would be separated among two buckets (two storage nodes) associated with that pixel. This arrangement is exemplified in the diagram in FIG. 4. In this example, an arbitrary pattern code is loaded into the control logic module 112, in some cases sequentially, prior to each of the pixels being exposed to light. Logic gates in the control logic module 112 can be used to decode a value for each of the masking bits, and thus provide appropriate control signals to a pixel readout circuit in the control logic module 112. These control signals can be used to control the charge transfer from the pixel photodiode in the imaging sensor 110 to one of two storage nodes (buckets or floating diffusion nodes) in the signal storage module 114. In the example of FIG. 4, if the masking bit signals that the pixel should be masked, the control logic would provide such control signals to block the charge (signal) transfer from the photodiode to the first storage node, and permit the charge (signal) transfer from the photodiode to the second storage node. In some cases, pixel output amplifiers in the digitization module 114 can take the signal (in this case, voltage) from the corresponding storage node and transfer it (or in other words, buffer it) to a respective pixel readout column line. As shown in FIG. 4, the memory for storing the mask bits in the control logic module 112 is split into two separate blocks; a first memory block for preloading a next pattern of masking bits and a second memory block for applying a current pattern of masking bits. When implementing the mask load, storage and usage, it can be useful to keep mask handling independent of the pixel exposure in order not to limit the time available for signal collection. Therefore, a pipelined operation of pre-storage of masking bits can be used via two memory blocks. The pipelined operation has an intended advantage of applying the masks to all pixels simultaneously (globally).

While the present disclosure references the image sensor 110 as a photodiode, any suitable photo-detector can be used; for example, a pinned-photodiode, a photo-gate, a charge-coupled device, a charge injection device, a single photon avalanche diode, or the like. While the present embodiments refer to a visible spectrum of light, light as referred to herein is understood to include any part of the electromagnetic spectrum along with, or instead of, light from the visible spectrum; for example, in the ultraviolet, near-infrared, short-wave infrared, and/or long-wave infrared.

Figure 5:
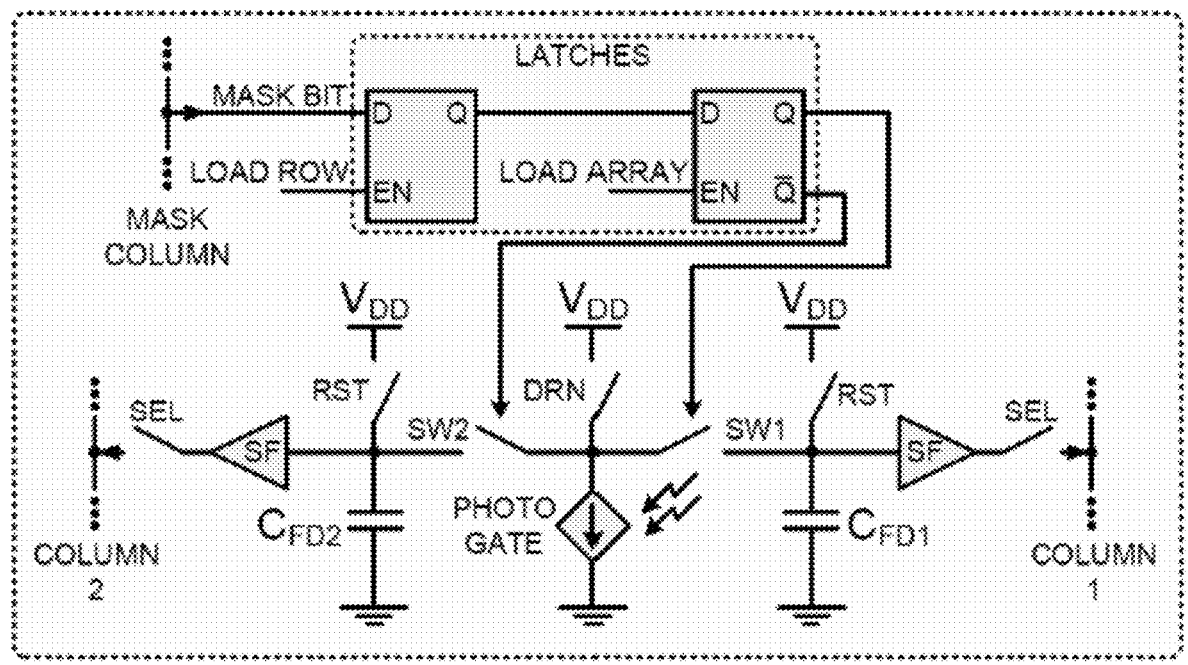
FIG. 5 is an exemplary circuit implementation of the system of FIG. 1 for a pixel array.

An example of a circuit structure for a pixel using the above exemplary structure is illustrated in FIG. 5. The first memory cell (latch), in the first memory block, is used to store the mask bit. The mask bit signal is routed vertically and is physically the same for the single column. When a corresponding LOAD ROW trigger signal arrives, the whole row of masks is loaded at the same time. In some cases, the mask bits can be loaded serially through separate channels and the bits can then be deserialized into a parallel data, i.e. 1-bit per every individual column. Once all the masks are loaded for all the rows individually, the complete mask for the full frame is latched by the second latch, in the second memory block. An example of this mask loading approach, for a single subframe, is exemplified in the illustration of FIG. 6. The mask loading approach can then be repeated for every subframe within a single frame. The two memory blocks allow for masking of light exposure for a current subframe, while masking patterns for the next subframe are loaded row-by-row. This results in pipelining the operation of the mask deserialization and loading with the regular pixel operation. The first cell is used to load the masks in a sequential "row-by-row" fashion. Once all rows receive their corresponding masks, the masks are then applied for the full pixel array simultaneously by loading the second memory cell. Depending on the state of the latched mask bit, switches SW1 and SW2, in the control logic module 112, can be used to steer the collected charge towards the appropriate bucket in the signal storage module 114. In this case, either a first bucket represented by capacitor $C_{FD1}$ or a second bucket represented by capacitor $C_{FD2}$. Moreover, since one of the switches is kept on during the readout, the channel capacitance of the switch modulates the overall floating diffusion capacitance. This allows the pixel to intrinsically have a different conversion gain in two buckets. For the exemplary application of direct and indirect light collection, this is an advantageous feature because usually direct light has significantly higher power than indirect light. An exemplary implementation of the circuit structure of FIG. 5 is shown using a transistor arrangement in FIG. 7; where the output 'Q' of the second latch is connected to 'C', the output 'Q'-bar of the second latch is connected to 'Cb', and 'CD' is used to flush the charges on the buckets.

Figure 36A:
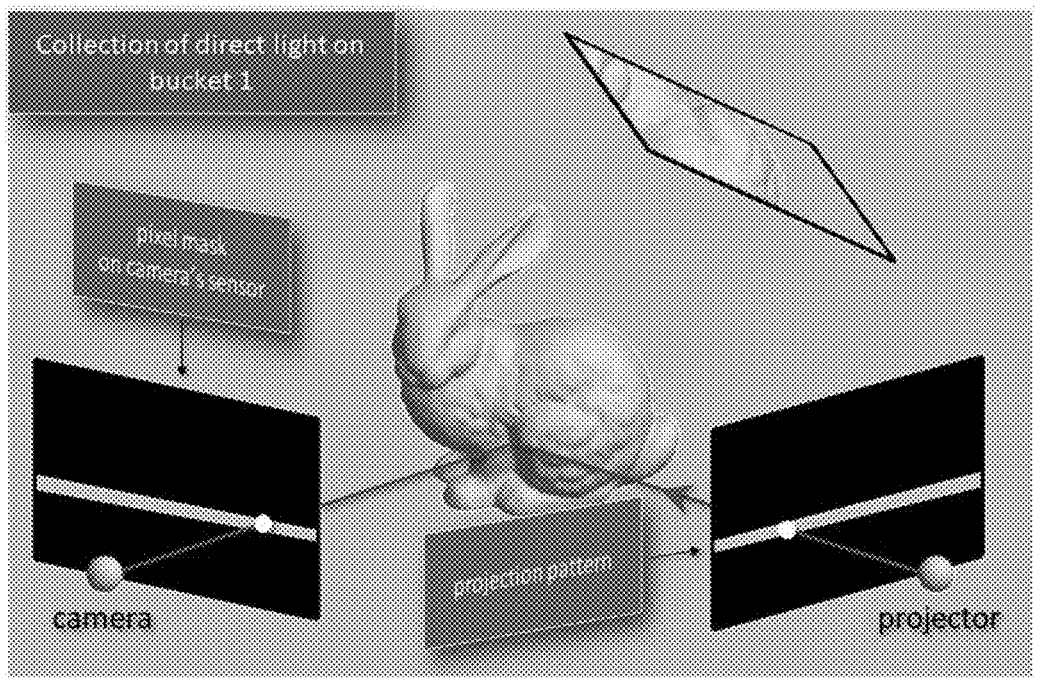
FIG. 36A is an exemplary illustration of projecting and receiving a direct light path on a scene using the system of FIG. 1.
Figure 36B:
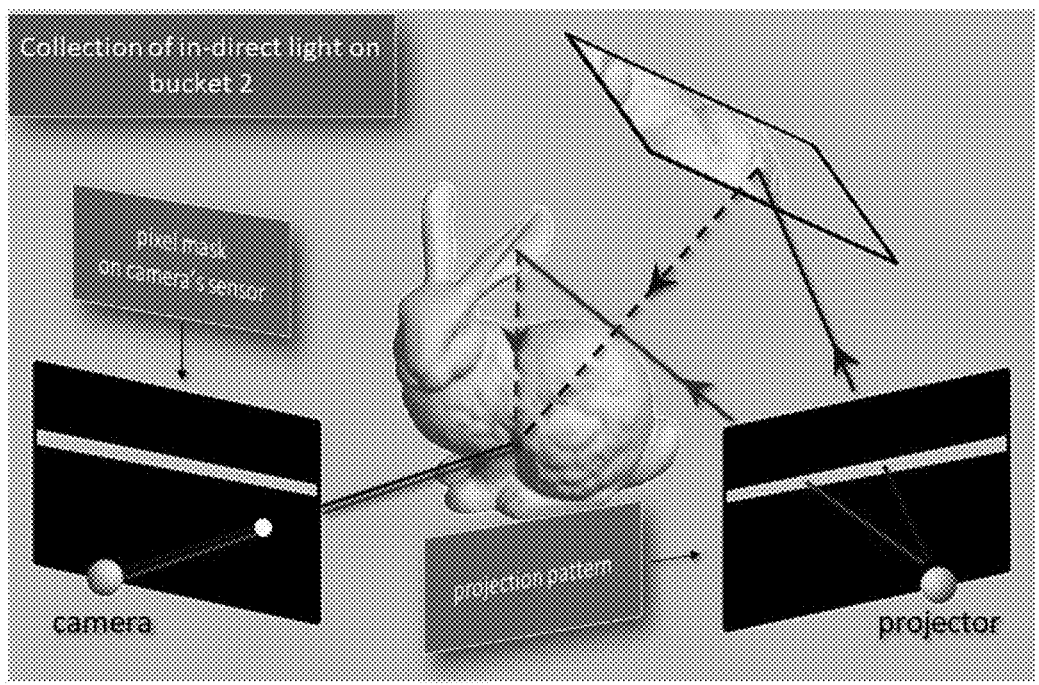
FIG. 36B is an exemplary illustration of projecting and receiving indirect light paths on the scene of FIG. 36A using the system of FIG. 1.

As shown in FIGS. 35A to 35D, light is captured by a conventional camera, or other image sensor, independent of the path the light takes. In contrast, an application of the system 100 is to discriminately capture light based on the path of the light. An example of a capture of epipolar direct and indirect light in a single pixel using the system 100 is illustrated in FIGS. 36A and 36B respectively. In some cases, a projector (or light source) can project a sheet of light, or in other cases, project via a raster-scan operation. FIGS. 36A and 36B each show an exemplary subframe out of n subframes. FIG. 36A illustrates capturing a direct light path of a specific pixel. While FIG. 36B illustrates capturing indirect (both scattering and specular) light. By defining a set of pixels (in this case a plane of pixels) at the image sensor 110 that correspond to a pattern projected at the projector (in this case a corresponding plane of pixels), the image sensor can collect light in a first bucket in the signal storage module 114 from light with direct paths and collect light in a second bucket in the signal storage module 114 from light with indirect paths. The set of pixels can be defined at the image sensor 110 using the control logic module 112 which, for example, applies a mask value of 1 for pixels that correspond to direct light paths and a mask value of 0 for pixels that correspond to indirect light paths.

In further embodiments, where only the direct light paths or only the indirect light paths are desired, only the light received from the corresponding pixels is stored in the signal storage module 114 and the other received light is discarded. In this way, in some cases, an off-the-shelf image sensor 110 can be used under specific lighting and timing conditions.

Figure 37A:
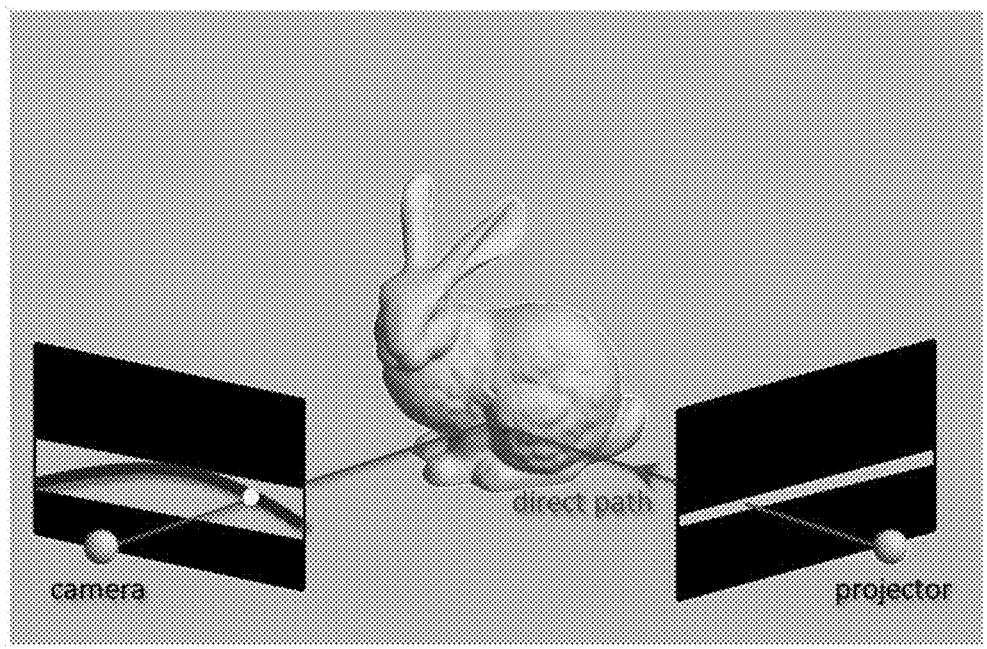
FIG. 37A is an exemplary illustration of projecting and receiving a direct light path on a scene where the light has a lensing effect.
Figure 37B:
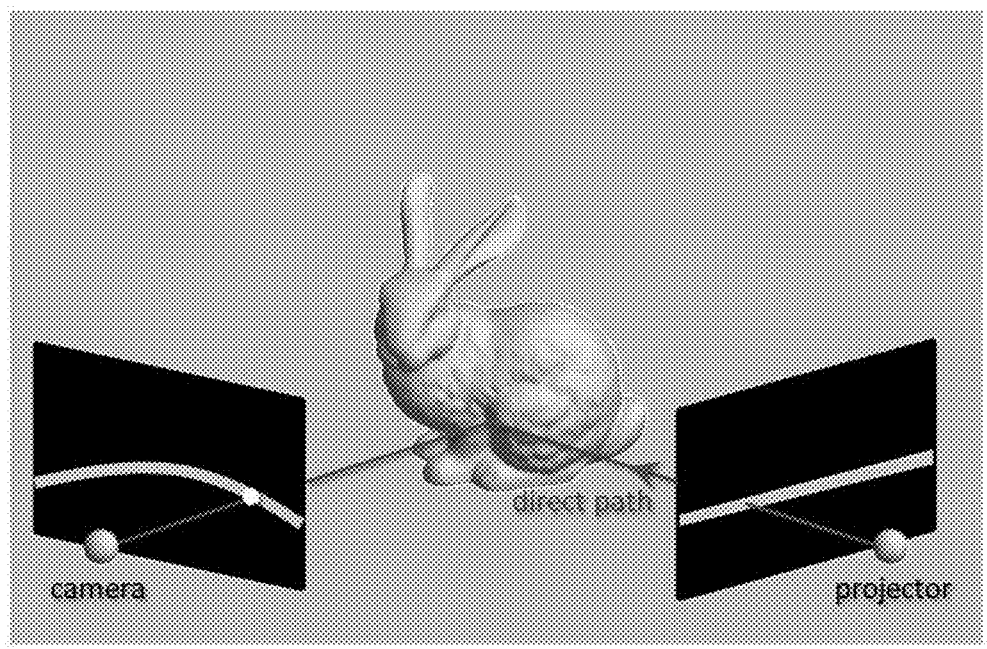
FIG. 37B is an exemplary illustration of projecting and receiving a direct light path on the scene of FIG. 37A compensating for a lensing effect using the system of FIG. 1.

In some cases, there may be radial distortion from a lens connected to the image sensor 110, and in some cases, connected to the projector. The lens can cause a straight-line path from the projector to map to a curved line path on the image sensor 110, as shown on FIG. 37A. In a case of a rolling shutter image sensor 110, timing conditions can result in significant loss in ambient or indirect-blocking performance. Using the system 100, as shown in FIG. 37B, the mask pattern can be programmed to mask the image sensor 110 in a curved fashion to accommodate the curved path of the light due to the lens.

Figure 38A:
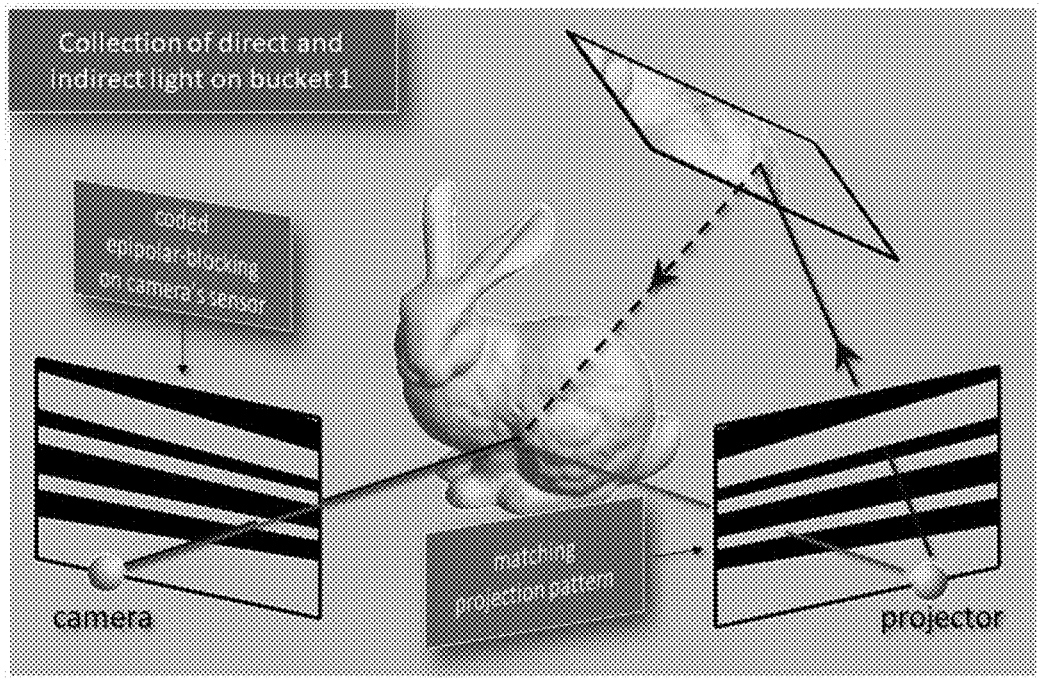
FIG. 38A is an exemplary illustration of projecting and receiving multiple light paths on a scene using a complex projection and masking pattern with the system of FIG. 1.
Figure 38B:
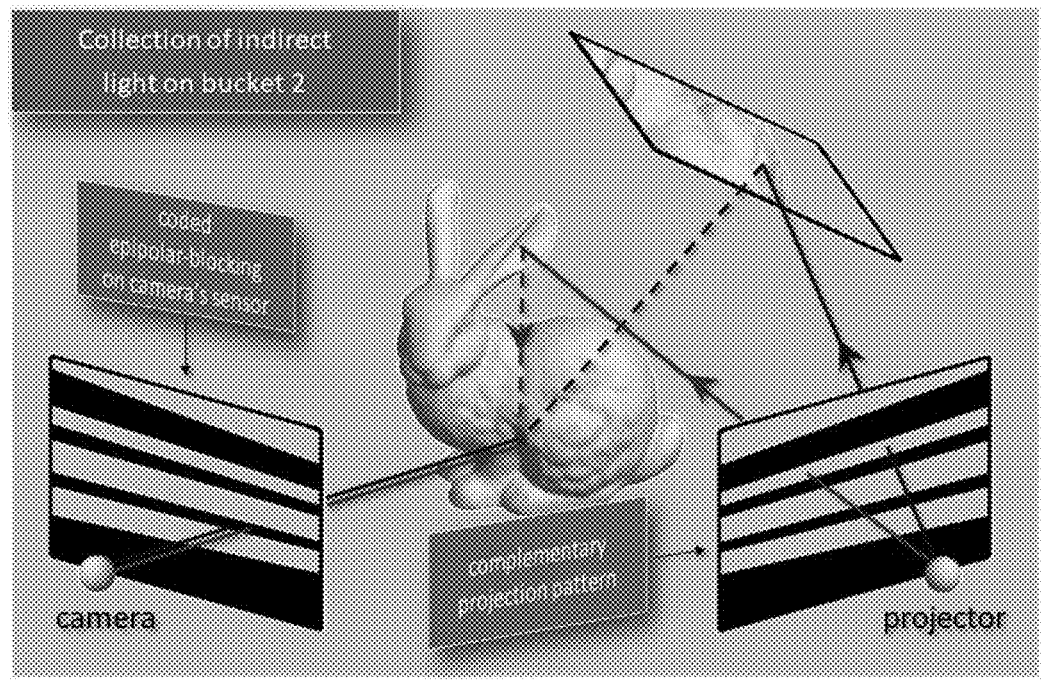
FIG. 38B is another exemplary illustration of projecting and receiving multiple light paths on the scene of FIG. 38A using a complex projection and masking pattern with the system of FIG. 1.

FIGS. 38A and 38B illustrate an example of a more complex masking pattern and projection pattern, including multiple planes (and other shapes) of corresponding pixels. In this case, the projector can project arbitrary projection patterns, which correspond to pixel masking patterns at the image sensor 110. In an example, the projector can be a DLP-based projector. This system 100 collects direct+½ indirect light in one bucket of the signal storage module 114 and ½ indirect light in the other bucket of the signal storage module 114. FIGS. 38A and 38B illustrate an example for one pixel in two different subframes. FIG. 38A shows a collection of direct+½ indirect in bucket 1 and FIG. 38B shows a collection of ½ indirect in bucket 2. In this case, an image with direct-path only contributions can be extracted by subtracting the pixel values of bucket 2 from that of bucket 1.

It will be appreciated that FIGS. 36A to 38B are illustrations simplified for the ease of presentation for this disclosure. In practical circumstances, the image sensor 110 and the projector can be calibrated such that the mapping of the pixels of the projector to the pixels of image sensor 110 can be determined with the pixel masks and the projections patterns determined accordingly. In practice, depending on the circumstances in which they are used, the pixel masks and the projections patterns do not necessarily have to appear complementary.

In cases where there is a stereo pair (in this case, the image sensor and the projector), a matrix can be used, called a fundamental matrix F, that relates lines of pixels on the image sensor 110 to lines of pixels projected by the projector. The fundamental matrix allows the system 100, via the processors 102, to determine lines of pixels on the projector that correspond to lines of pixels on the image sensor 110 that represent direct paths of light. For example, if there are $x_1$ and $x_2$, which are points on the image sensor 110 and the projector respectively, then $x_1' F x_2=0$ if and only if $x_1$ and $x_2$ are on corresponding epipolar lines. If $x_1$ or $x_2$ are fixed, then $x_1'F$ and $Fx_2$ provide parameters of a corresponding line (ax+by+c=0). In this case, homogeneous coordinates are used for $x_1$ and $x_2$, which means that they are 3D vectors with the first two coordinates being an x and y positions respectively on the image sensor/projector, and the last coordinate being 1. Accordingly, fundamental matrix F can be used to find corresponding epipolar lines.

In an example, the fundamental matrix can be determined using correspondences. Since $x_1' F x_2=0$, correspondences can be determined between the image sensor 110 and the projector, which provides lists of correspondences ($x_1$ and $x_2$). A system of linear equations can be solved to determine the elements of fundamental matrix F.

In the present embodiments a latch can be used as memory, however in further embodiments, any suitable data memory storage device may be used; for example, flip-flop, SRAM, DRAM, FLASH, memristor, PCM, magnetic hard-drive, charge bucket, or the like.

Figure 8A:
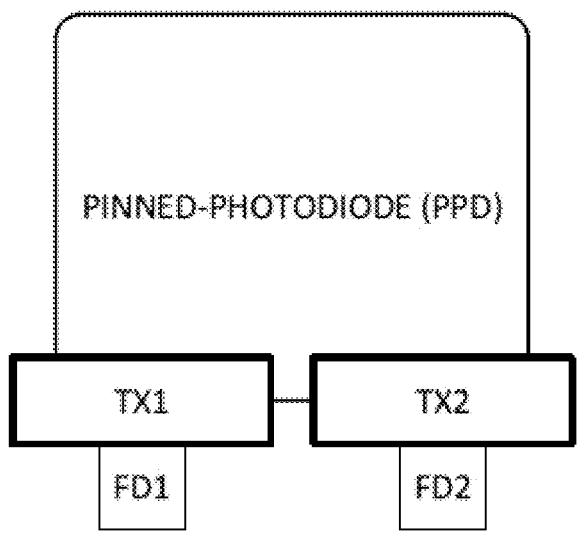
FIG. 8A is an example of a photo-detecting and mixing structure within a pixel layout for the system of FIG. 1 with two storage nodes.
Figure 8B:
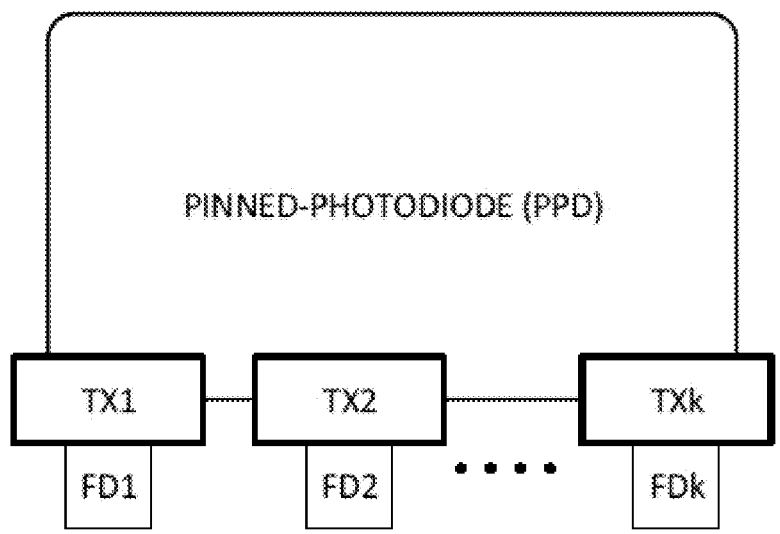
FIG. 8B is an example of a photo-detecting and mixing structure within a pixel layout for the system of FIG. 1 with 'k' number of storage nodes.

Generally, on a physical-level, signal masking (or mixing or sorting) uses an implementation of multiple charge transfer gates, where the gates are used to convey the signal (flow of electrons as a result of received light energy) towards the appropriate bucket. An example of portions of an integrated circuit layout for the system 100 is shown in top-view in FIG. 8A. This exemplary embodiment uses two buckets (referred to as floating diffusions—FD1 and FD2). Floating diffusion is implemented as an n-doped region of silicon sitting in a p-doped substrate. TX1 and TX2 are transfer gates to implement the control logic, the gates are implemented using polycrystalline silicon. The image sensor 110 is a pinned-photodiode of PNP-type structure with a thin highly doped p-layer (pinning layer) sitting on top of a N-doped region implanted on a lightly doped p-substrate (photodiode). Another exemplary embodiment is shown in FIG. 8B, which illustrates a plurality of (k) buckets. Thus, necessitating a greater number of transfer gates (TX1, TX2, . . . TXk) and a greater number of floating diffusion nodes (FD1, FD2 . . . FDk).

Figure 9:
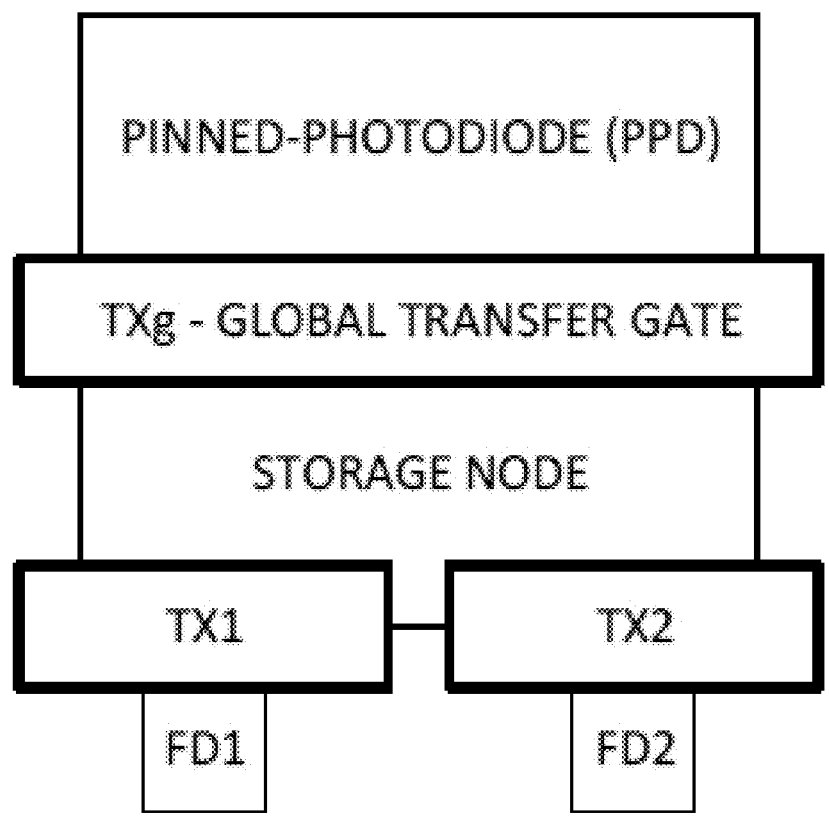
FIG. 9 is an exemplary diagrammatic top view of a pixel layout for the system of FIG. 1 with two storage nodes.
Figure 10:
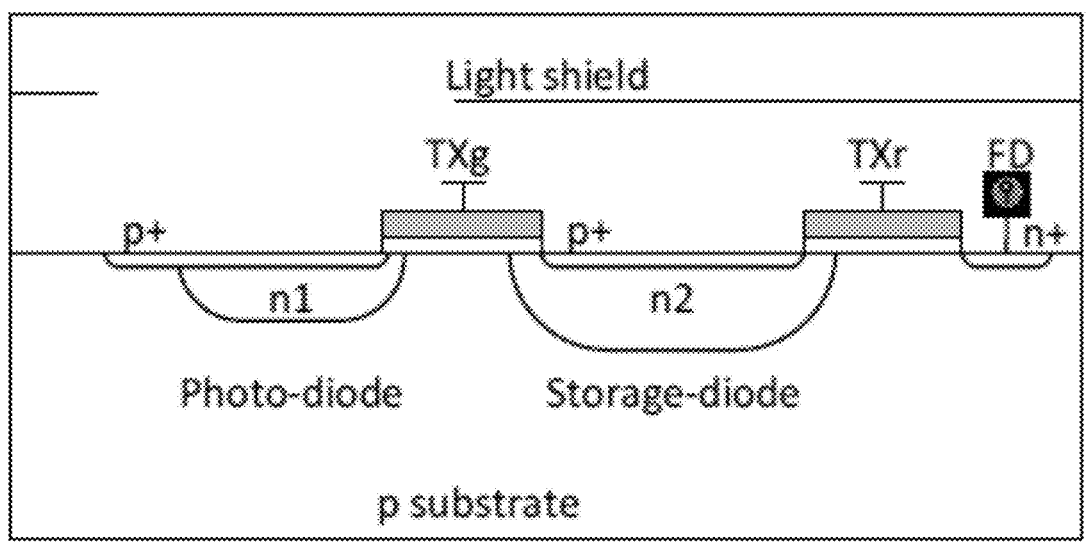
FIG. 10 is an exemplary cross-section of an implementation of the pixel of FIG. 9.
Figure 11:
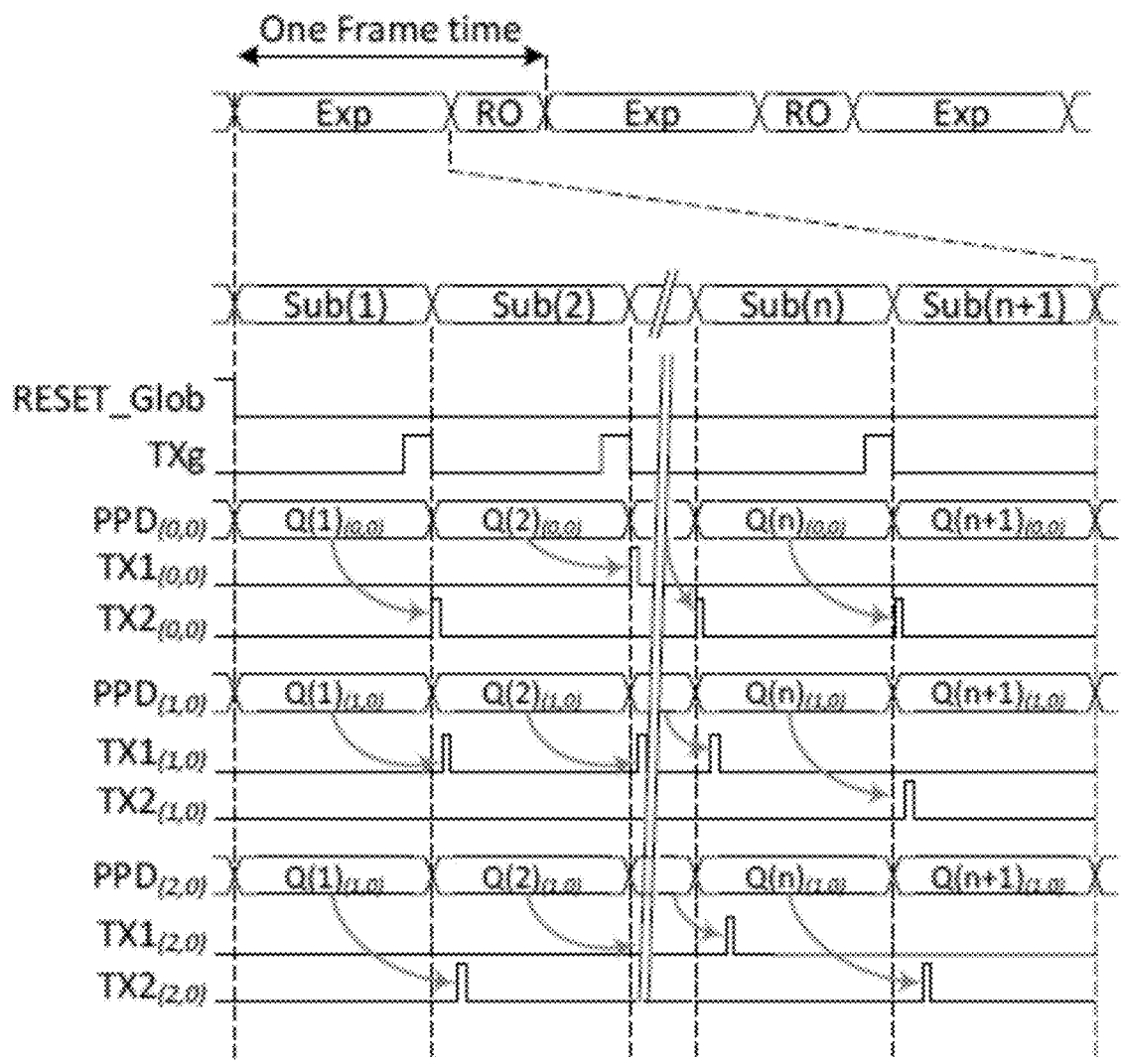
FIG. 11 is a signal waveform diagram of the implementation of the system in FIG. 1, using the pixel in FIG. 9.

Arbitrary pixel-wise programmable exposure can be implemented using an in pixel signal storage nodes in the signal storage module 114 and a combination of transfer gates in the control logic module 112. A cross section of another exemplary implementation of an integrated circuit layout for the above is shown in FIG. 10. In this example, a pinned diode structure is used both as a photodetector and as a signal storage device. An integrated circuit layout for the above is shown in FIG. 9 and corresponding signal waveforms for its operation are shown in FIG. 11. In this example, as shown in FIG. 9, TXg is a global transfer gate in the signal storage module 114 used to transfer the signal (charge) from a pinned photodiode (PPD) in the image sensor 110 to a storage node, in the signal storage module 114, at the end of each subframe. This transfer is completed at the same time for each pixel in the image sensor 110 pixel array. The structure of the storage node is similar to the pinned photodiode (PPD) device, but it is shielded from the incoming light and only used to store charge; thus, it is not used to collect light-induced electrons like the photo-detecting pinned-photo-diode. Transfer gates TX1 and TX2 in the control logic module 112 are used to control flow of the charge to the buckets; in this case, two buckets referred to as floating diffusions FD1 and FD2. The transfer gates are controlled based on a value of a masking bit, as described above. Therefore, the voltage of the global transfer gate (TXg) becomes high after every subframe, as illustrated in the waveform of FIG. 11. The voltages of transfer gates TX1 and TX2 go high starting from the beginning of each subframe in a sequential fashion (for example, row-by-row). Since the storage node for each pixel in the rows of pixels are read sequentially, depending on the value of the masking bit for each pixel, a different transfer gate can be set high for each pixel (either TX1 or TX2). Therefore, in this example, a charge stored in the storage node associated with a previous subframe, can be transferred to the floating diffusion while the pinned photodiode is integrating (collecting) charge of a current subframe.

Figure 12:
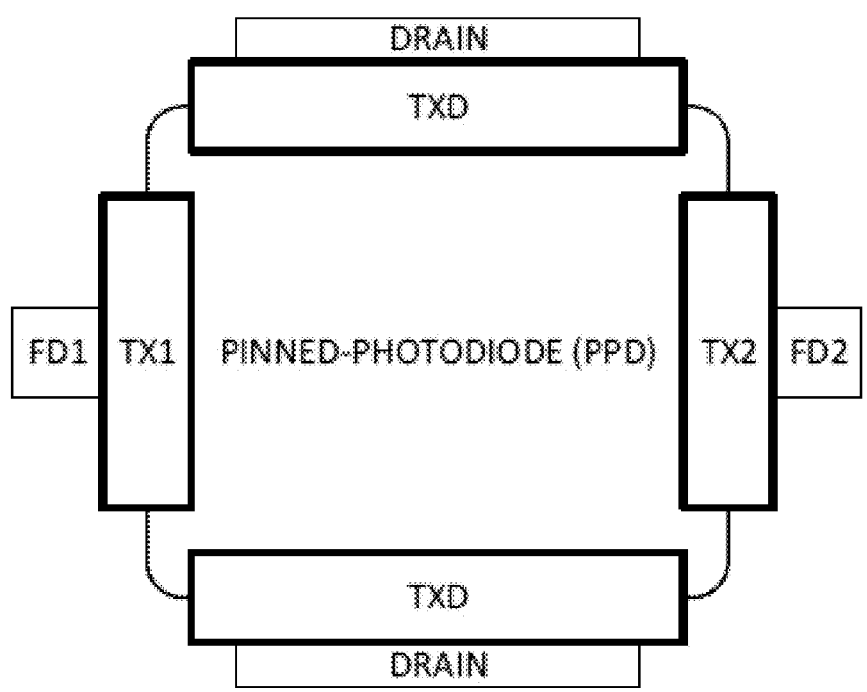
FIG. 12 is a diagrammatic top view of another implementation of one pixel in the system of FIG. 1 for time-of-flight applications.

In further cases, arbitrary pixel-wise exposure control of system 100 can be used and applied in various imaging modalities. FIG. 12 illustrates an exemplary layout of portions of the system 100 for use in continuous-wave time-of-flight imagery. Time-of-flight imaging technique involves temporal modulation (at the light source) and demodulation (on the sensor side) of light intensity which allows the processor 102 of the system 100 measure distances to objects in the scene, and therefore to reconstruct a 3D view of the scene. The distances are measured by estimating the phase difference between the transmitted and received light signal intensity. The received light signal has a phase-shift compared to the transmitted light due to the time needed for light to travel from the light source to the object, and to travel back to the sensor after being reflected. This allows the system 100 to simultaneously operate as both a coded-exposure and a time-of-flight sensor to render 3D imaging insensitive to all types of multipath and background interferences. This allows the system 100 to improve performance and enables it to have advantageous capabilities; for example, time-of-flight imaging, such as "seeing around corners," or sparse deconvolution by time-encoding. Due to its capability to provide a 3D representation of a visual scene, time-of-flight represents an advantageous application of the system 100.

Figure 13:
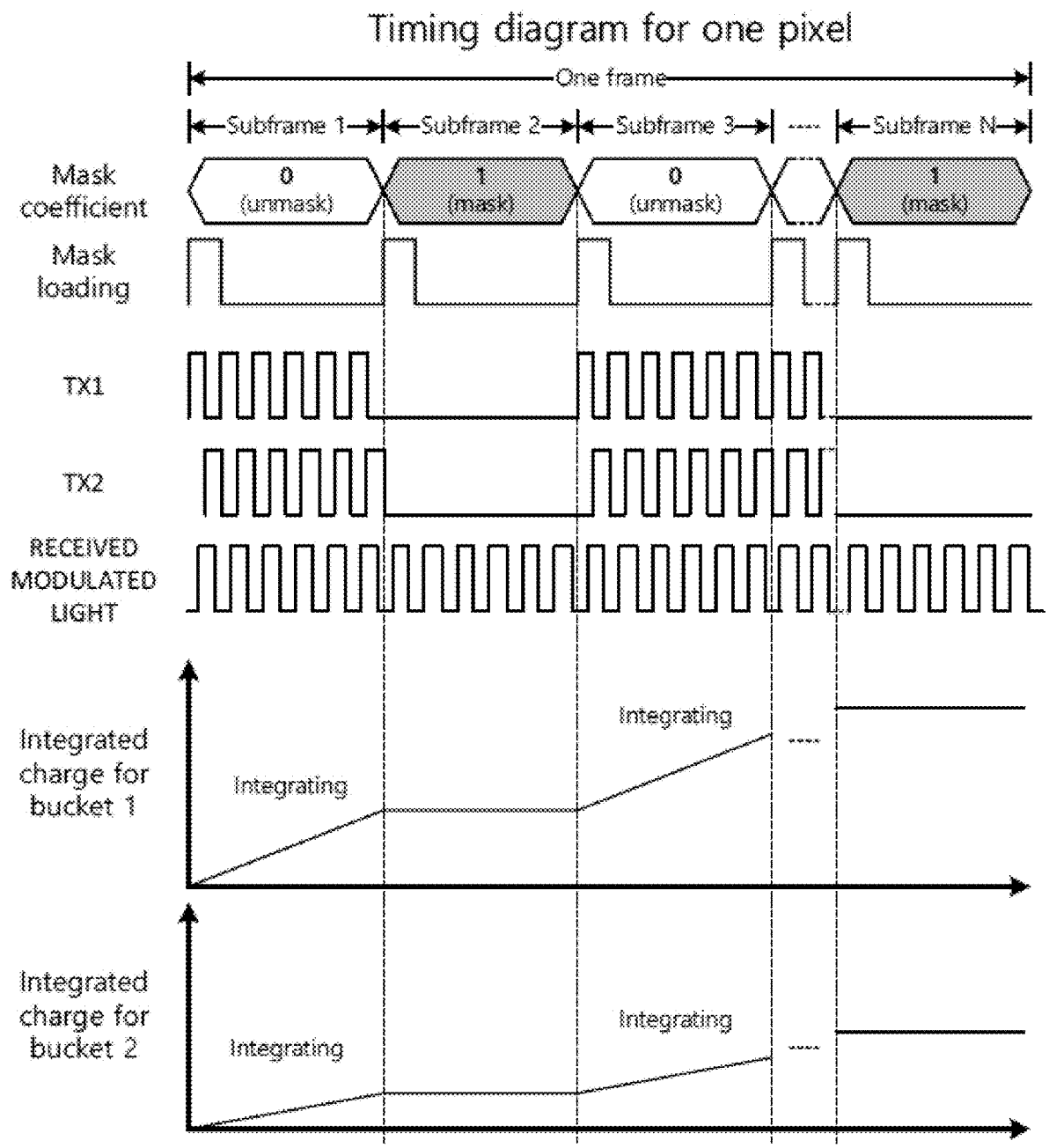
FIG. 13 is an exemplary timing diagram of the implementation of FIG. 12.

FIG. 13 illustrates exemplary timing diagram for one pixel showing signal waveforms to implement time-of-flight pixel masking. When the pixel is masked (represented by a binary code of 1), both of time-of-flight modulation gates (TX1 and TX2) in the control logic module 112 are closed, and therefore no signal is integrated. Drain gates (TXD) in the in the control logic module 112 are opened at that time to drain any residual charge (signal) from the photodetector to avoid any interference between consecutive signal samples. When the pixel is unmasked, also known as exposed (represented by a binary code of 0), the modulation gates (TX1 and TX2) in the control logic module 112 are alternatively opened such that buckets FD1 and FD2 in the signal storage module 114 collect the signal based on the shape and phase of the demodulation signal. In the case of FIG. 13, the first bucket FD1 receives the signal when a modulation signal, associated with a modulated light source, is on, and the second bucket FD2 receives the signal when the modulation signal is off. In this way, a phase difference between the modulated light source and signal received at the image sensor can be determined, and thus used to determine time of flight.

Figure 14:
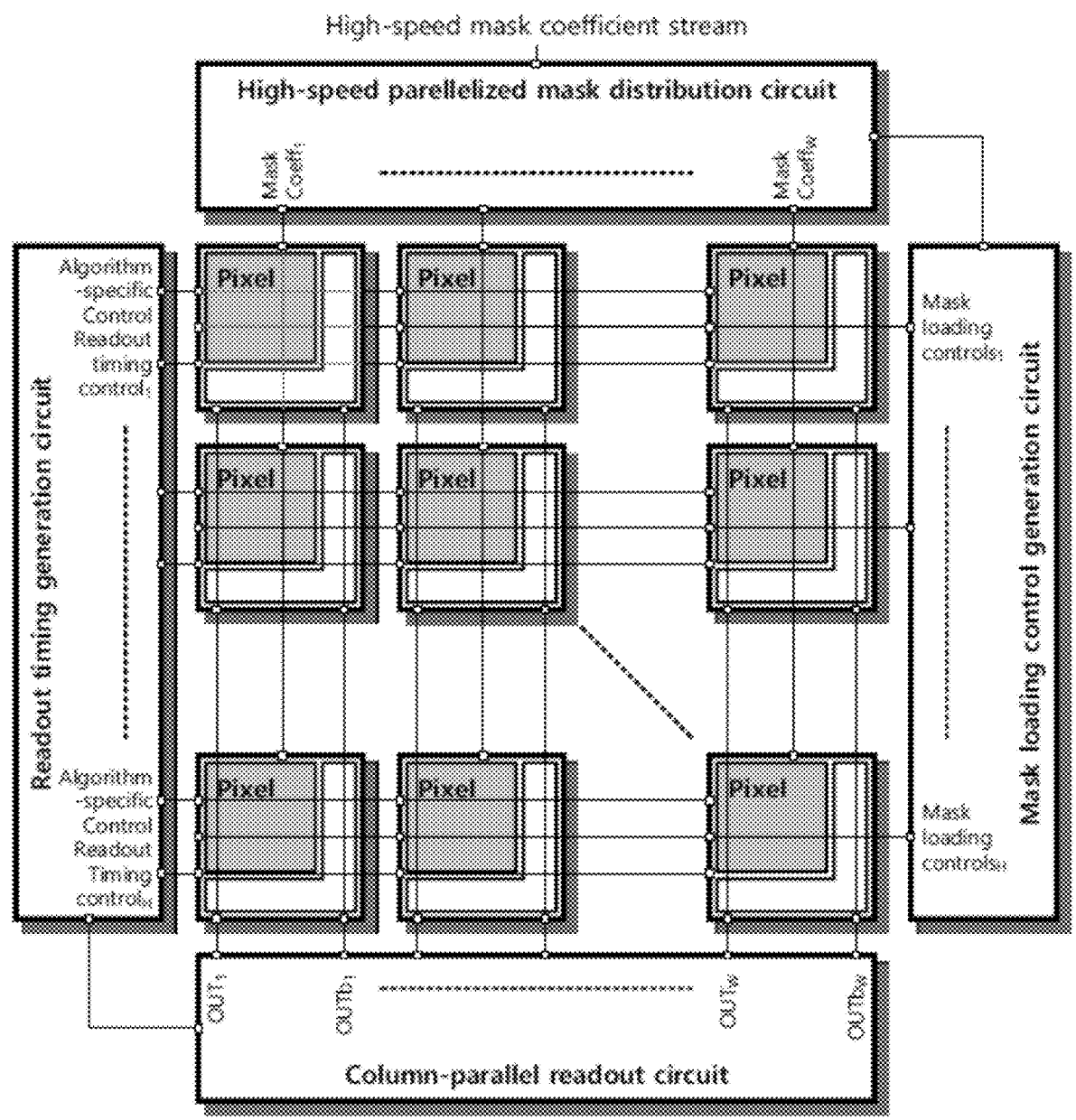
FIG. 14 is an exemplary embodiment of an architecture for various components of the system of FIG. 1.

FIG. 14 illustrates an exemplary structure of portions of system 100 for a multi-pixel array. This implementation uses a combination of two in-pixel latches, as described with respect to FIG. 7, to sequentially load bit masks row-by-row, then apply the masks globally for a subframe to mask the pixel array approximately simultaneously.

Figure 6:
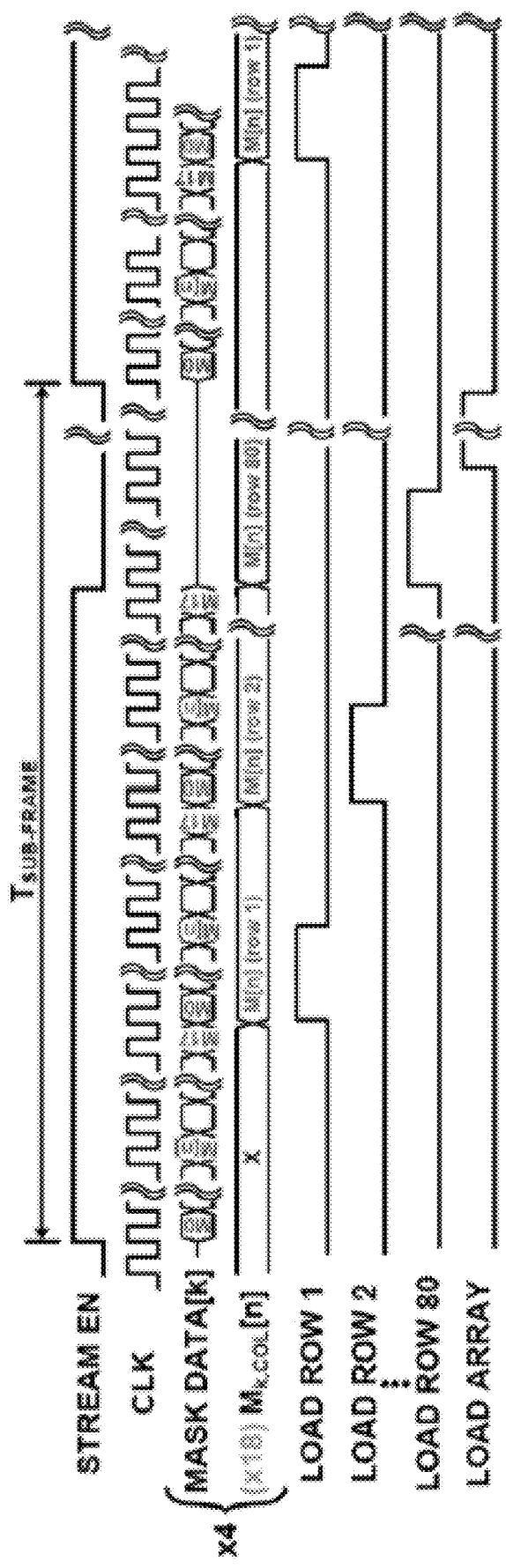
FIG. 6 is a waveform diagram for the circuit implementation of FIG. 5.
Figure 7:
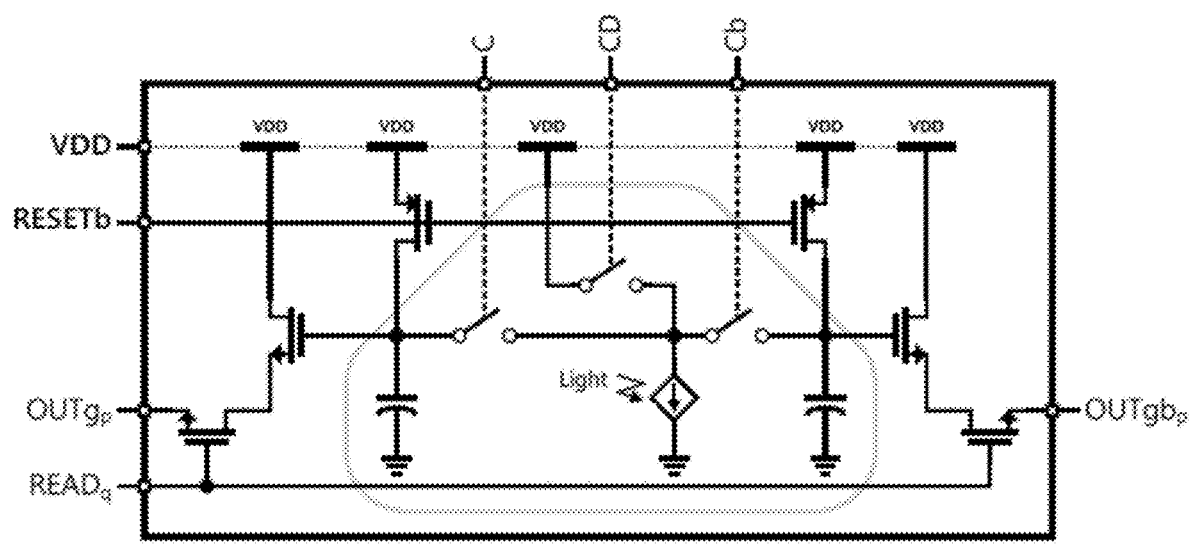
FIG. 7 is an example of a transistor-level implementation of a two-bucket photonic mixing device and readout blocks of FIG. 3 for one pixel.
Figure 15:
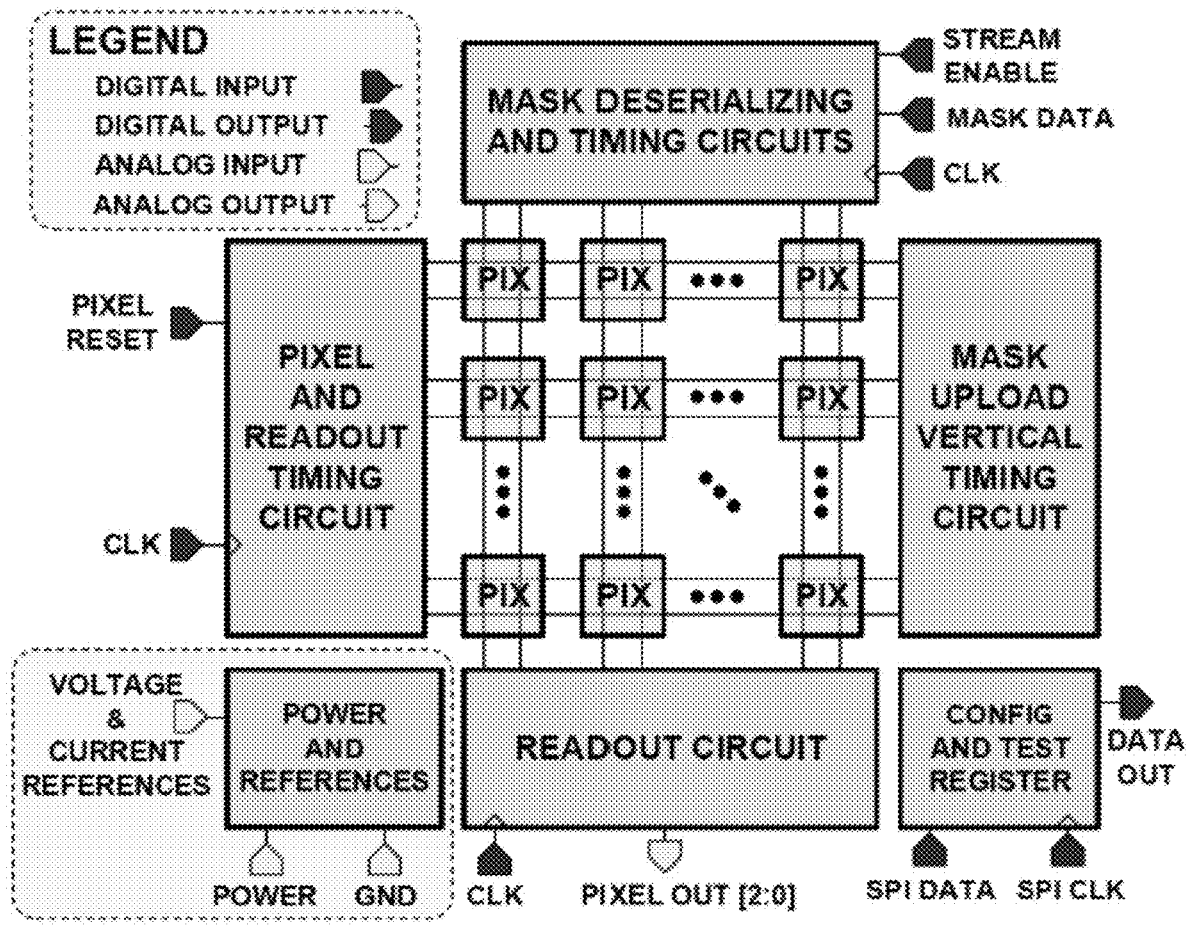
FIG. 15 is another exemplary embodiment of an architecture for various components of the system of FIG. 1.

Another example of a CMOS image sensor implementation of portions of the system 100 is shown in FIG. 15. As shown, there is a typical arrangement of peripheral circuits and interfaces for an imaging sensor. An example of a timing diagram showing signal waveforms of masking data for this exemplary implementation are shown in FIG. 6.

Figure 16:
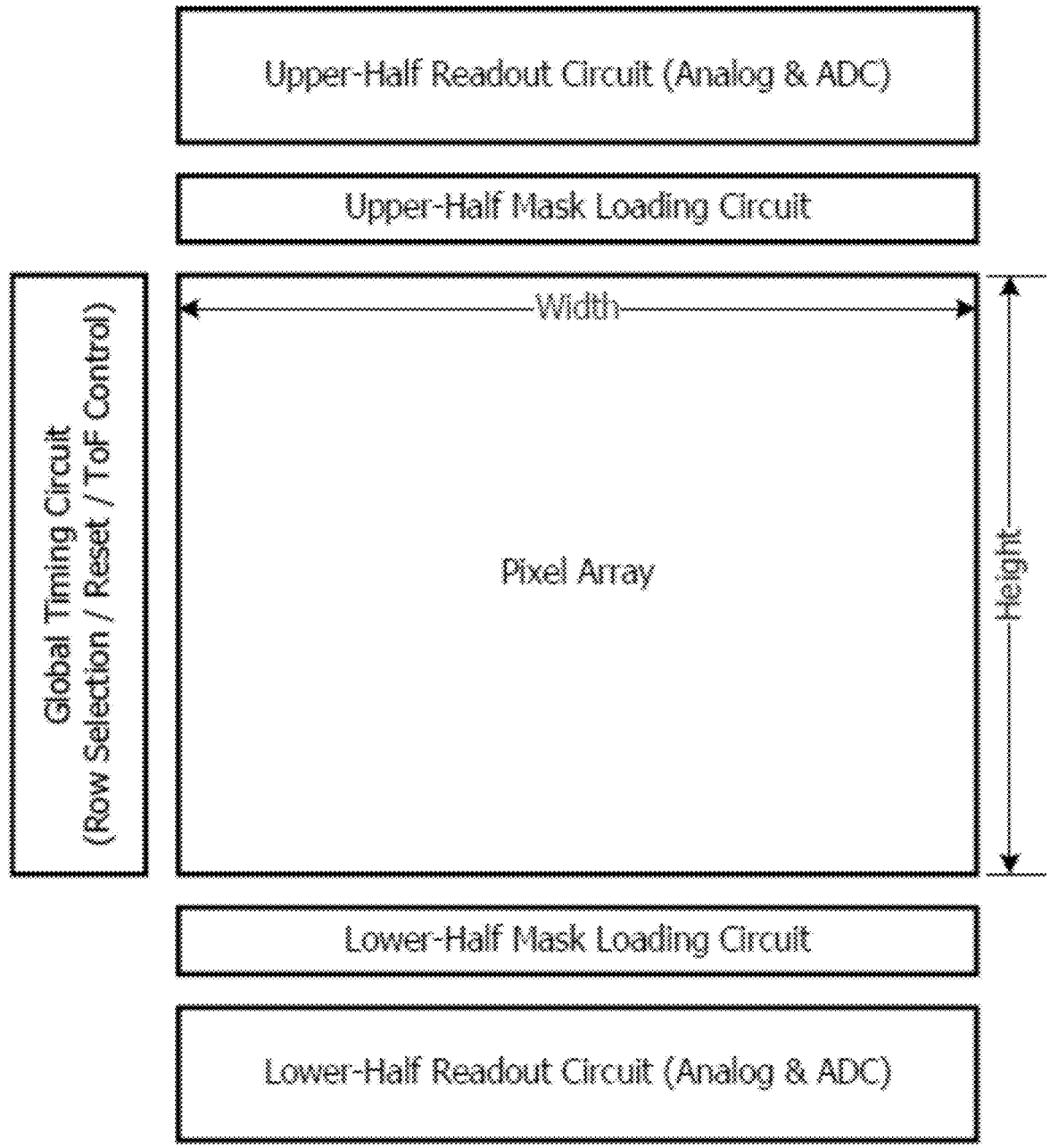
FIG. 16 is another exemplary embodiment of an architecture for various components of the system of FIG. 1 where loading circuitry are on both sides of a pixel array to improve speed.

Another exemplary structure of portions of the system 100 is shown in FIG. 16. In this case, peripheral circuits and interfaces for the imaging sensor are split between the top and bottom sides of the pixel array.

Figure 17:
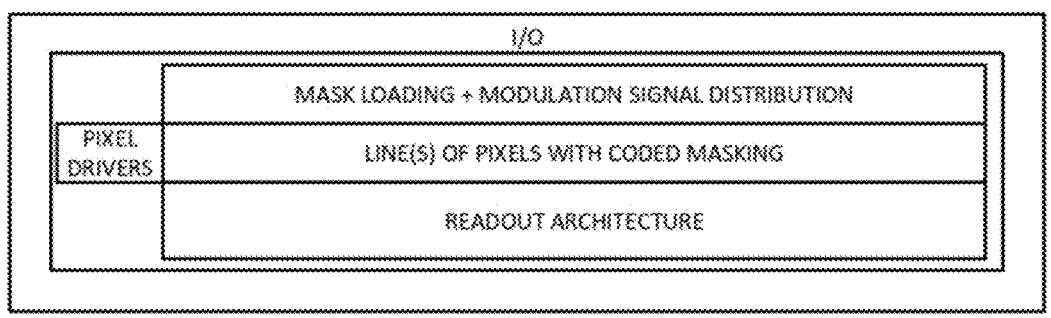
FIG. 17 is an exemplary diagram of a line (1D) image sensor architecture for various components of the system of FIG. 1.

FIG. 17 illustrates another example of the arbitrary pixel-wise programmable exposure of parts of the system 100 as applied to a line sensor type of imaging sensor 110. Line sensors can capture photons via one single pixel row, or via multiple rows of different pixels. In some cases, mask loading circuits of the control logic module 112 may be connected adjacent each of the pixels. In other cases, the mask loading circuits can be located peripherally to the pixel line/array area. In the diagrammatic example shown in FIG. 17, the mask loading and signal modulation circuits are located on one side of the pixel array and the readout circuits on the other side. Other ways to arrange these circuits, including both on-chip and off-chip, are also possible.

Figure 18:
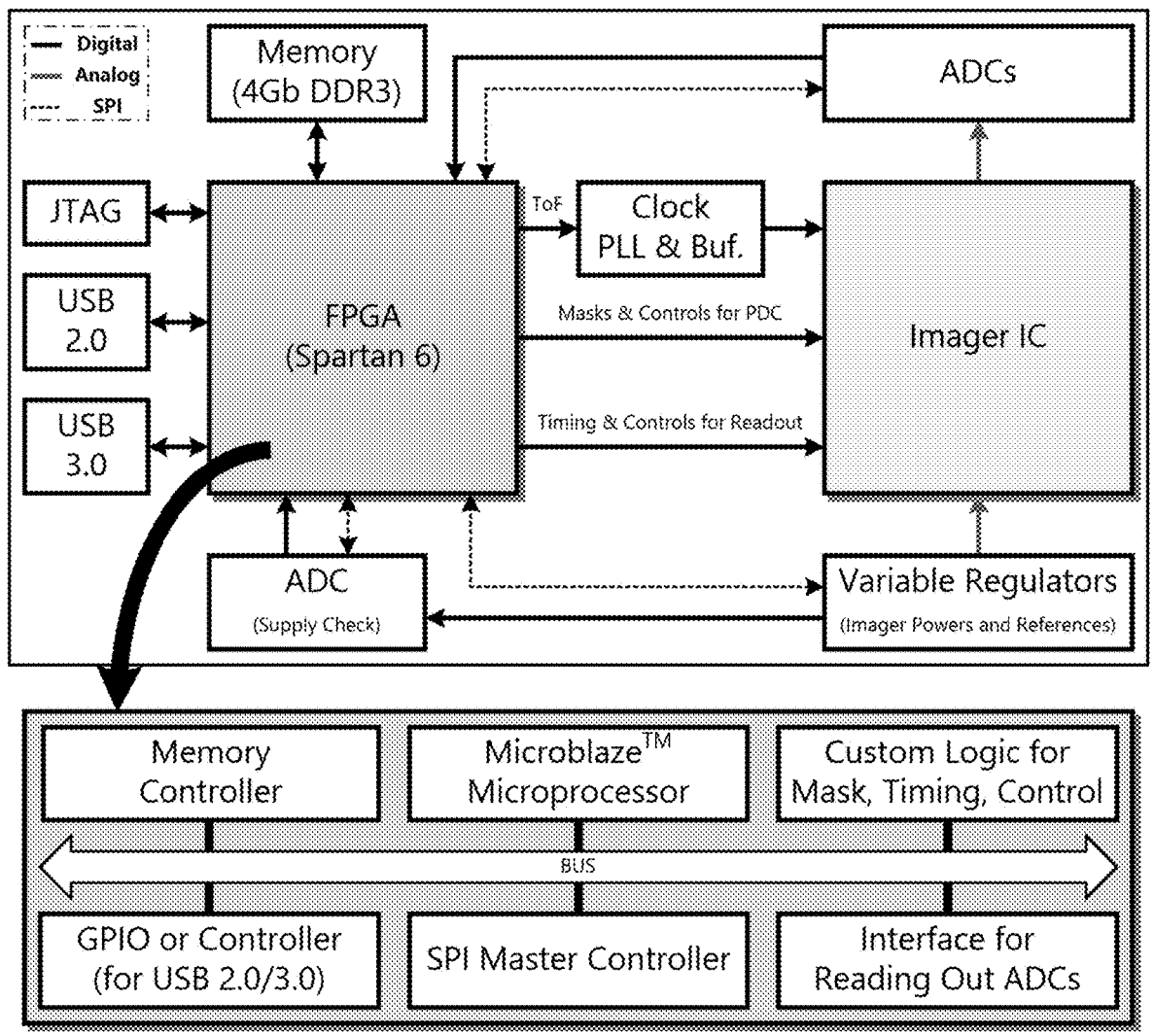
FIG. 18 is an exemplary embodiment of overall architecture of the system of FIG. 1.

FIG. 18 is an exemplary implementation of the system 100 in a camera environment. In this case, the per-pixel programmable exposure image sensor 110 is denoted as imager integrated circuit (IC). The camera environment includes data storage 104, depicted here by an off-imager-chip DRAM memory (DDR), with masking controls stored in DRAM and sent to Imager IC by an FPGA. The code-storing memory can also be implemented directly on the imager IC or another IC wire-bonded, flip-chip bonded or chip-stacked with it. The digitization module 116 (here denoted as analog-to-digital converter (ADC)) converts the signal from analog charges to digital values, and in some cases, may be located off-chip. In other cases, the ADC can also be implemented on-imager-chip.

The embodiments described herein can provide image sensing systems that combine spatial and temporal exposure coding to deliver per pixel programmability and thus enhanced performance capabilities to imaging applications. As exemplified by testing done by the Applicant, the number of arbitrary pattern-mask exposures within one video frame capable by the system 100 can reach and exceed 1000 for a nominal frame rate of 30 frames-per-second. This is a substantial increase of over an order of magnitude in the amount of processed sensory information compared to any approaches that use digital micro-mirror devices, liquid crystal panels, phase modulators, or the like.

Additionally, cameras utilizing the embodiments described herein can be advantageously used in applications in which refraction and scattering can be selectively blocked or enhanced. For example, allowing visual structures too subtle to notice with the naked eye can become apparent. In another example, object surfaces can be reconstructed in three dimensions using time of flight approaches under challenging conditions, such as under direct sunlight, beyond of what is possible with conventional imaging technologies. Thus, "depth cameras" using the present embodiments can have had a tremendous impact on computer vision and robotics technologies.

Using the embodiments described herein, transport-aware imagers can be programmed to selectively detect only some of that light, depending on the actual 3D paths the light beams followed through a scene. Application domains of such imagers are numerous; for example, 3D sensing, visual recognition, gesture analysis, robotic navigation, industrial inspection, and medical/scientific imaging. Conventional transport-aware camera prototypes typically require a large mechanically deforming digital micromirror device (DMD) to implement programmable sensor masking, which introduces a number of significant disadvantages; for example, they have an excessively large form factor that is a barrier to portable consumer electronics, they have prohibitively high levels of distortion due to DMD-imposed large-lens curvature, they have low electro-mechanical mask update speeds that significantly limit the range of applications, they have high power dissipation that hinders mobile implementations, and they have a prohibitively high cost. In contrast, the embodiments described herein offer previously unattainable versatility in coded-exposure imaging (CEI).

Figure 27:
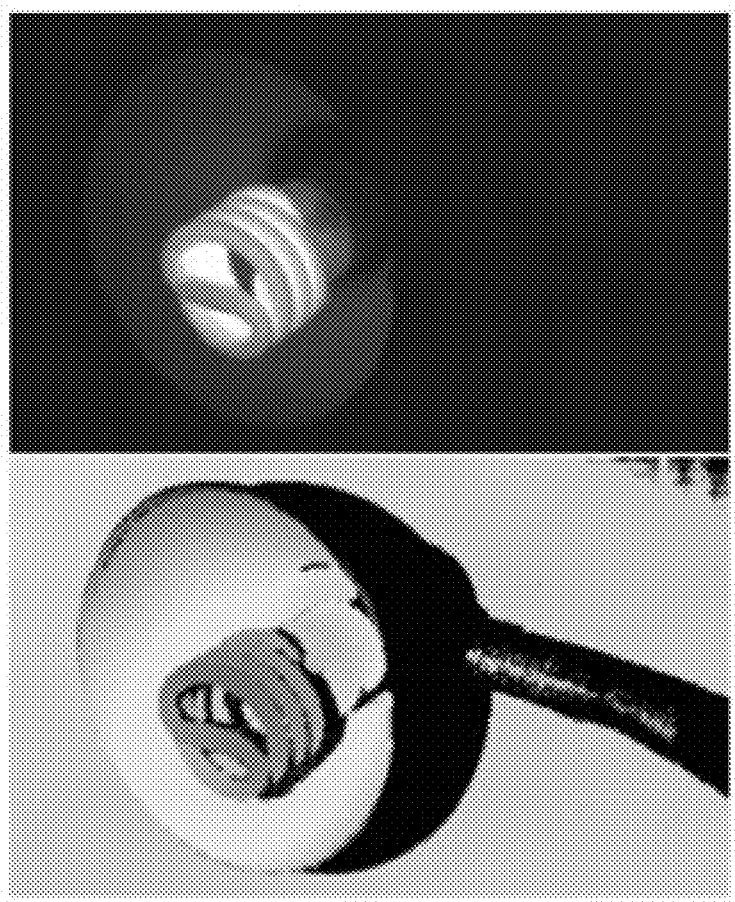
FIG. 27 shows a captured 3D map of a 1600 Lumen light bulb using a conventional camera and using the system 100 of FIG. 1.
Figure 28:
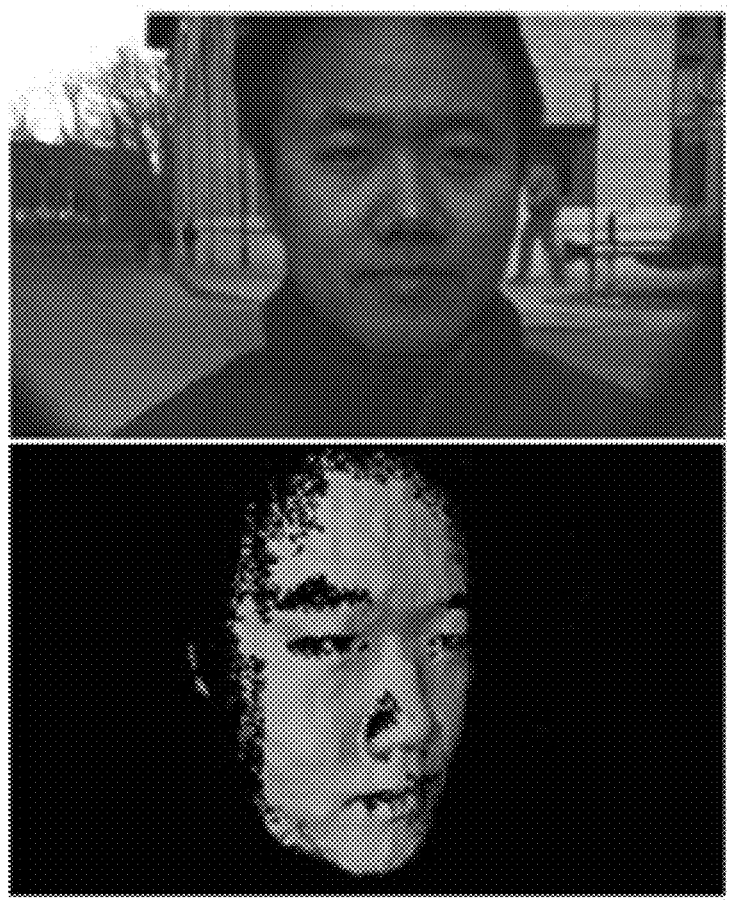
FIG. 28 shows an image captured in bright sunlight with a conventional camera and with 3D imaging using the system of FIG. 1.
Figures 29A, 29B:
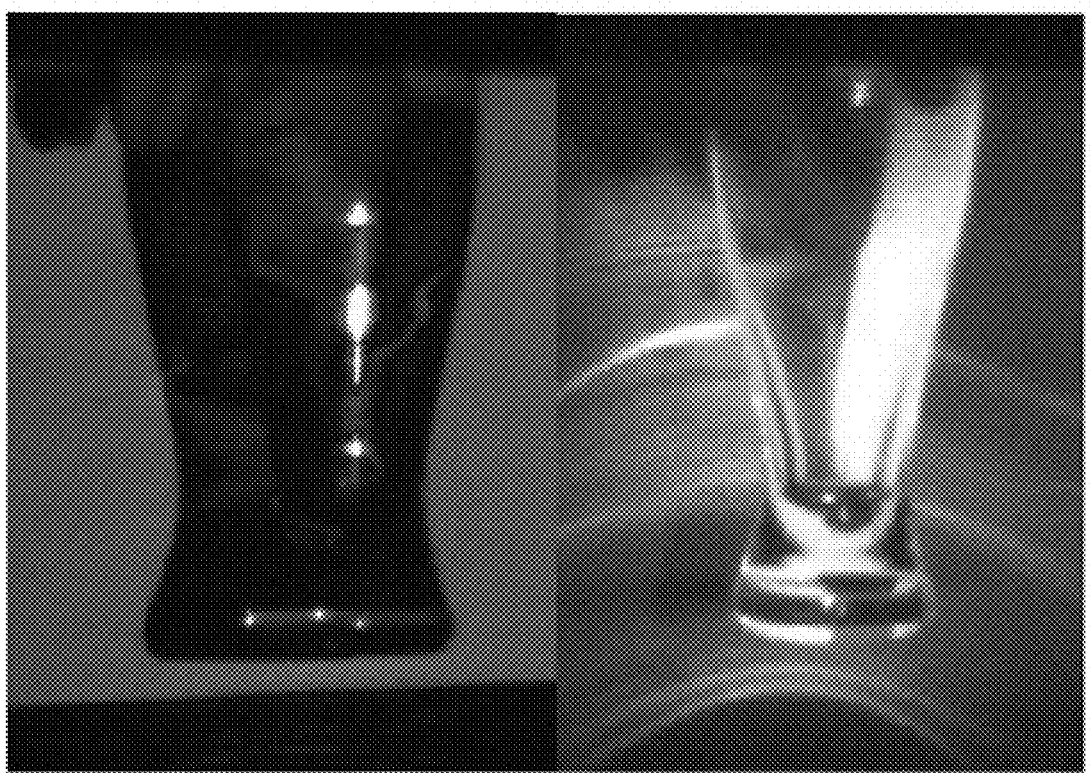
FIG. 29A shows an image captured using only direct light reflected only once using the system of FIG. 1.
FIG. 29B shows that same scene of FIG. 29A except showing only indirect light captured using the system of FIG. 1.
Figures 30A, 30B:
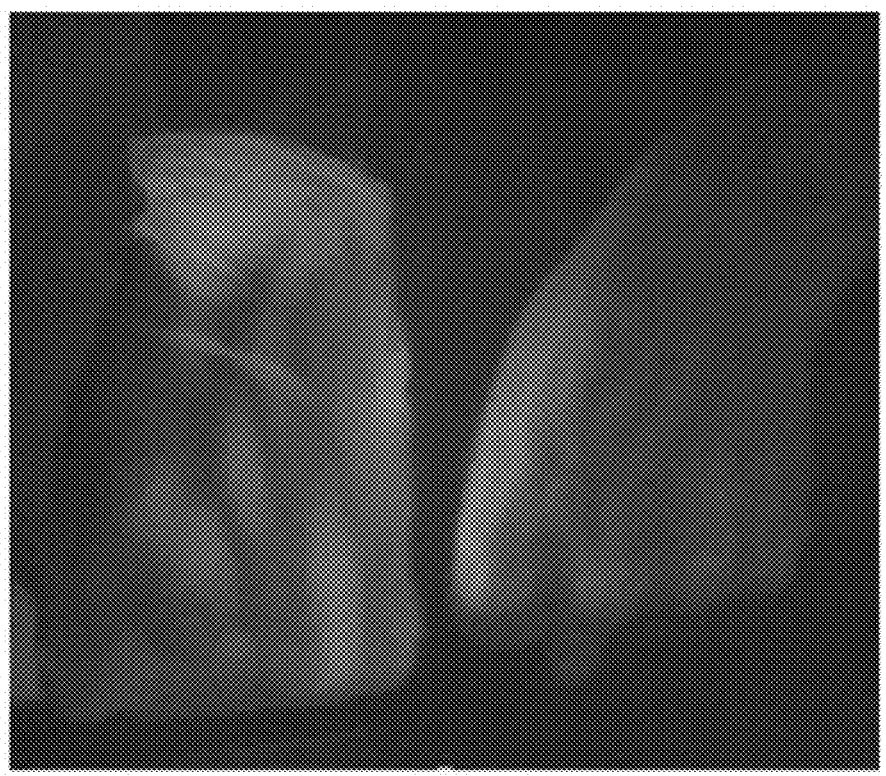
FIG. 30A shows an image captured of a latex glove by the system of FIG. 1 capturing only indirect light.
FIG. 30B shows an image captured of a hand by the system of FIG. 1 capturing only indirect light.
Figure 31A:
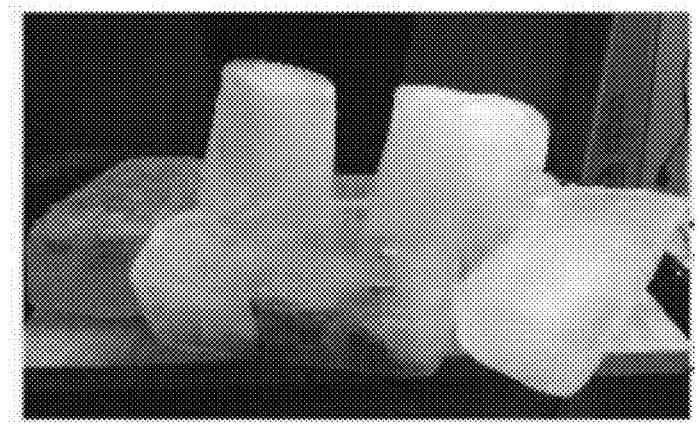
FIG. 31A shows a scene of ice blocks captured by a conventional camera.
Figures 31B, 31C:
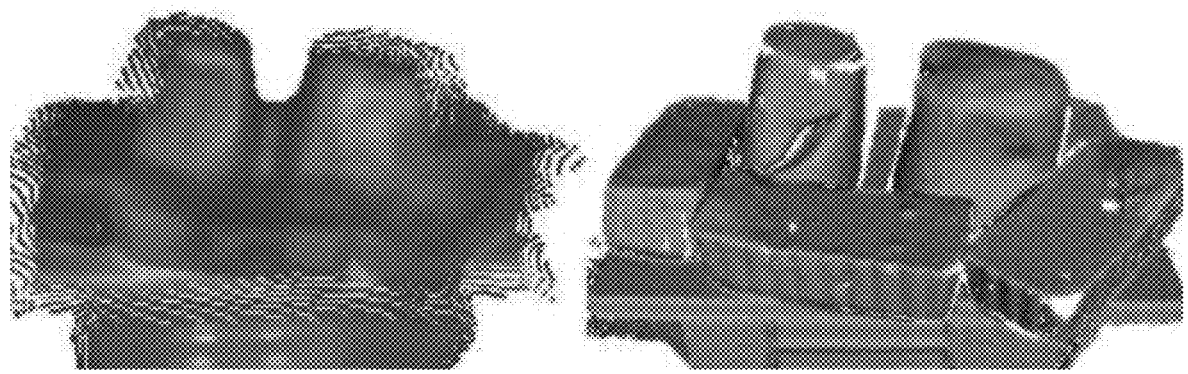
FIG. 31B which shows a 3D image captured using conventional time-of-flight imaging of the scene of FIG. 31A.
FIG. 31C shows 3D imaging of the scene of FIG. 31A using the system of FIG. 1 capturing direct-only light travel.

In experiments, using a low-power projector, the system 100 has demonstrated several generally unique capabilities. For example, reconstructing 3D objects in challenging visual scene conditions. FIG. 27 shows a captured 3D map of a 1600 Lumen light bulb with a conventional camera (above) and with the system 100 (below). FIG. 28 shows an image in bright sunlight with a conventional camera (above) and 3D imaging using the system 100 (below) in bright sunlight. FIG. 29A shows capturing only direct light reflected only once in a scene using the system 100. FIG. 29B shows that same scene except this time showing only capturing indirect light, which is the light reflected multiple times in the scene, using the system 100. FIG. 30A shows the system 100 being used to capture only indirect light and thus being able to, at least partially, see through a latex glove; or as shown in FIG. 30B, at least partially, see through skin of a human hand. FIG. 31A shows a scene of ice blocks captured by a conventional camera. FIG. 31C shows 3D imaging of the ice blocks, using the system 100, by sensing the time of direct-only light travel. In contrast to FIG. 31B which shows a 3D image captured using conventional time-of-flight imaging where indirect light (bouncing off multiple objects before returning to the camera) skews the resulting image and reduces depth resolution.

Time-of-flight cameras, as described herein, can be used for vision and computational photography tasks, for event cameras that support asynchronous imaging for high-speed motion analysis, and for 3D scanning. Using the system 100 described herein, a coded two-bucket (C2B) camera can be implemented for, at least, time-of-flight imaging. The C2B camera is a coded exposure camera that generally does not block incident light. Instead, it modulates the incident light arriving at each pixel by controlling which of the two "buckets" in the signal storage module 114 associated with the pixel should integrate it. In this way, the system 100 can output two images per video frame, one per bucket, and allows rapid, fully-programmable per-pixel control of the active bucket via binary 2D masking patterns.

Figure 32:
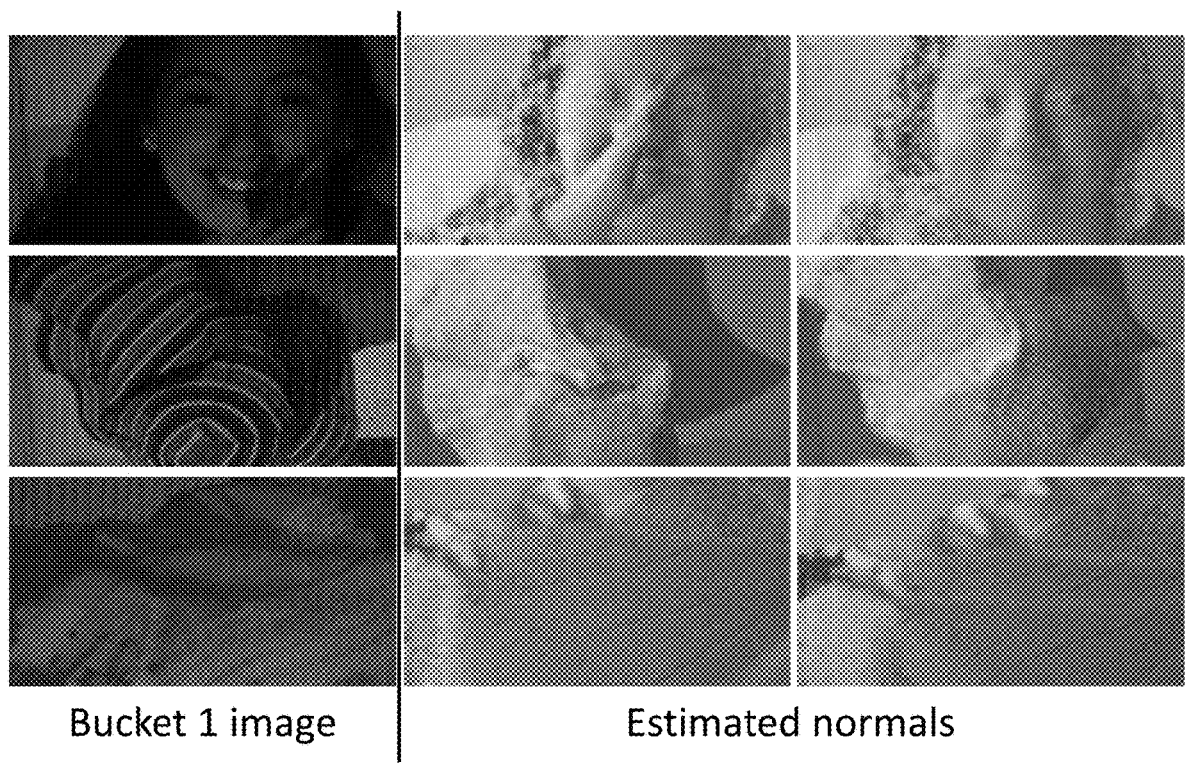
FIG. 32 illustrates an example of images captured using the system of FIG. 1 showing images received in a first bucket and a determined normal.
Figure 33:
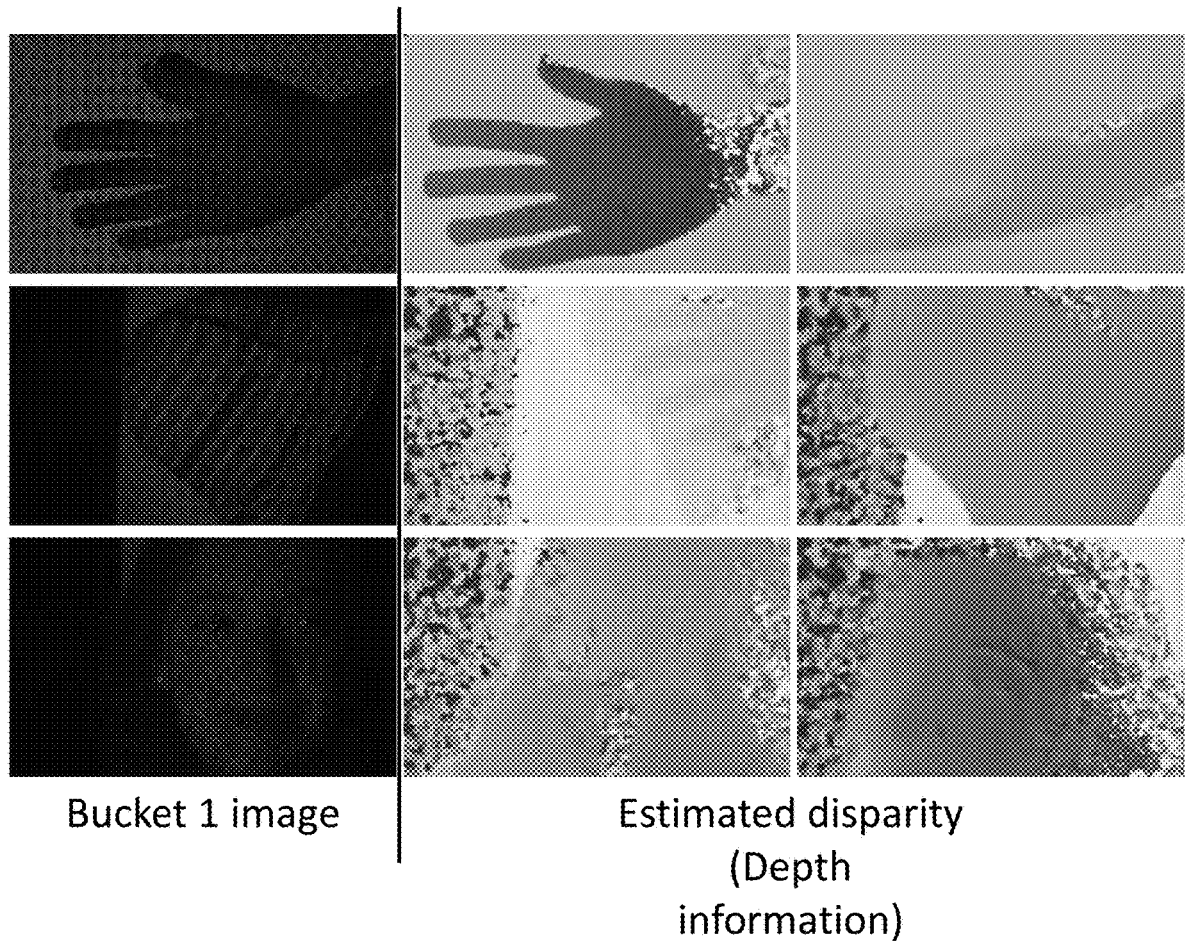
FIG. 33 illustrates an example of images captured using the system of FIG. 1 showing both images received in a first bucket and an estimated disparity between two buckets as depth information.

The light efficiency and electronic modulation of C2B cameras makes them particularly well suited for coded-exposure imaging and light transport analysis tasks. An exemplary application of the system 100, as described below, is for dense one-shot three-dimensional (3D) reconstruction. Specifically, using one C2B video frame of a dynamic scene under active illumination, reconstructing the scene's 3D snapshot, via per-pixel disparity or normals, at a resolution as close as possible to the imaging sensor's pixel array. The Applicant advantageously determined that C2B cameras, using approaches described herein, allows for solving of a very technically difficult 3D reconstruction problem by exploiting a two-dimensional (2D) problem of image demosaicing. FIG. 32 illustrates an example of images captured using the system 100 showing both images received in the first bucket and determined normal. FIG. 33 illustrates an example of images captured using the system 100 showing both images received in the first bucket and estimated disparity between the buckets as depth information.

As shown, C2B cameras can acquire, in one video frame, views of a scene under L linearly-independent illuminations, multiplexed across buckets of L−1 pixels. Such a frame is referred to as a two-bucket illumination mosaic. For this mosaic, the ratio of bucket measurements at each pixel is an illumination ratio, which is less dependent on spatial albedo and/or reflectance variations, and is potentially easier to demosaic. Additionally, by demosaicing either the illumination mosaic or its bucket ratio, full-resolution images of an imaged scene can be obtained for the purpose of dense reconstruction.

Generally, conventional coded-exposure sensors cannot control per-pixel exposure because they rely on a global signal to set the active bucket of all pixels. In this respect, the C2B camera, using system 100, allows for an optimal tradeoff between the desire for multiple measurements per pixel, which leads to large pixels, complex designs and small fill factors, and the desire to maintain flexibility by not hard-coding on the imaging sensor the number of simultaneous per-pixel measurements.

Figure 19:
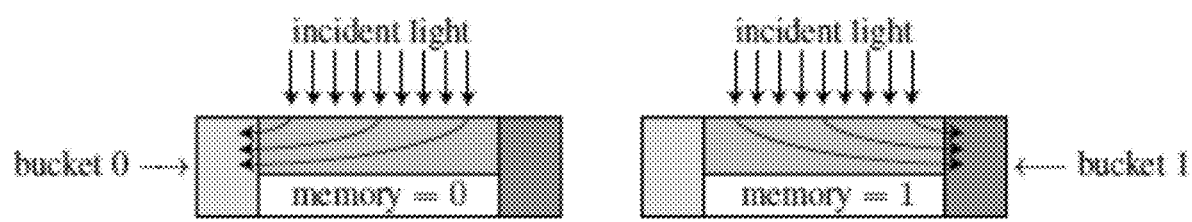
FIG. 19 is a diagram representing two states of a two bucket pixel for the system of FIG. 1.
Figure 20:
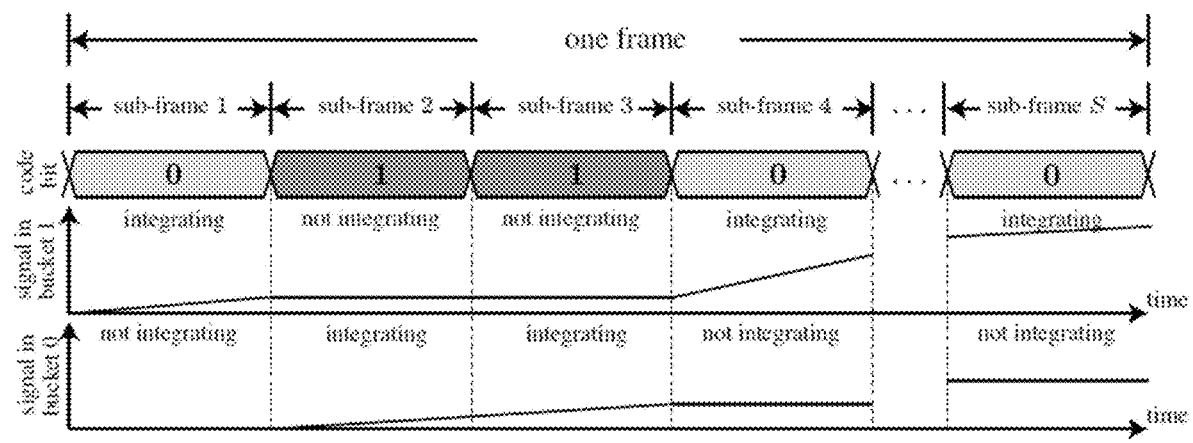
FIG. 20 is another exemplary timing diagram of the system of FIG. 1.

In an embodiment, pixels in a C2B camera, incorporating system 100, differ from those of a conventional camera. In a C2B camera, each pixel is associated with two buckets in the signal storage module 114. Each bucket can be a distinct circuit, in some cases an analog circuit, for integrating light received at the photodetector 110 of the pixel. Both buckets can integrate the light that falls onto the pixel's photo-sensitive area but, in most cases, only one them is actively integrating at any given time. As above, each pixel has associated with it a one-bit digital memory (known as a mask) in the control logic module 112 that controls which of its two buckets is active, as diagrammatically illustrated in FIG. 19. This mask is programmable, it can be updated many times within a single frame (as shown in the timing diagram of FIG. 20), and each pixel's associated mask may differ from pixel-to-pixel. At the end of each frame, two intensities can be read out and digitized by the digitization module 116 for each pixel, i.e., the digitized contents of the pixel's two buckets. In the present embodiment, C2B cameras can therefore output two images per video frame, one for each bucket; referred to herein as a bucket-1 image and a bucket-0 image, respectively.

Programming of a C2B camera can include specifying time-varying contents of each pixel's associated masking value at various timescales; for example, (1) at the scale of sub-frames within a video frame, which corresponds to updates of in-pixel memories, or (2) at the scale of frames within a video sequence. For a video sequence with F frames and a camera that has P pixels and supports S sub-frames, bucket activities can be represented as a three-dimensional binary matrix C of size P×F×S. C is referred to as a code matrix and is diagrammatically illustrated in FIG. 21.

Figure 21:
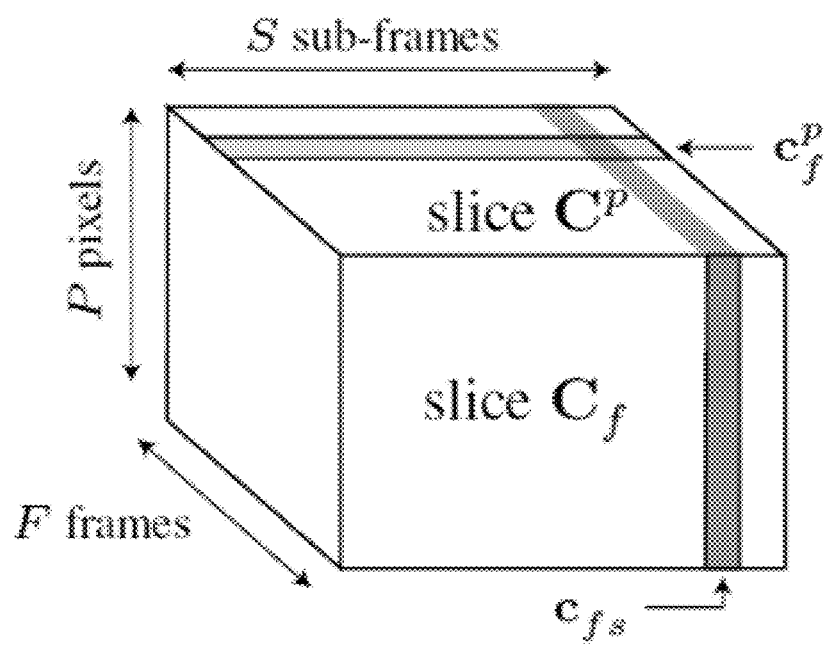
FIG. 21 is a diagrammatic illustration of an example code matrix.

As illustrated in in FIG. 21, two specific 2D "slices" of the code matrix C can be used. For a specific pixel p, slice $C^p$ describes the activity of pixel p's buckets across all frames and sub-frames. Similarly, for a specific frame f, slice $C_f$ describes the bucket activity of all pixels across all sub-frames of f:

$$c^p = \begin{bmatrix} c_1^p \\ c_2^p \\ \vdots \\ c_F^p \end{bmatrix}_{f \times s}$$

$$c_f = \underbrace{[c_{f1} \quad c_{f2} \quad \cdots \quad c_{fS}]}_{p \times s},$$

where $c^p$ is an S-dimensional row vector that specifies the active bucket of pixel p in the sub-frames of frame f; and $c_{fs}$ is a column vector that specifies the active bucket of all pixels in sub-frame s of frame f.

Although C2B cameras can be used for passive imaging applications in place of coded-exposure cameras, the present embodiment considers the more general case where illumination is programmable at sub-frame timescales. In particular, the scene's time-varying illumination conditions are represented as an S×L illumination matrix L that applies to all frames:

$$L = \begin{bmatrix} l_1 \\ l_2 \\ \vdots \\ l_S \end{bmatrix}_{s \times l},$$

where row vector $I_s$ denotes the scene's illumination condition in sub-frame s of every frame. In this example, two types of scene illumination are considered: a set of L directional light sources whose intensity is given by vector $I_s$; and a projector that projects a pattern specified by the first L−1 elements of $I_s$ in the presence of ambient light, which is treated as an L-th source that is "always on" (i.e., element $I_s[L]=1$ for all s).

Figure 22:
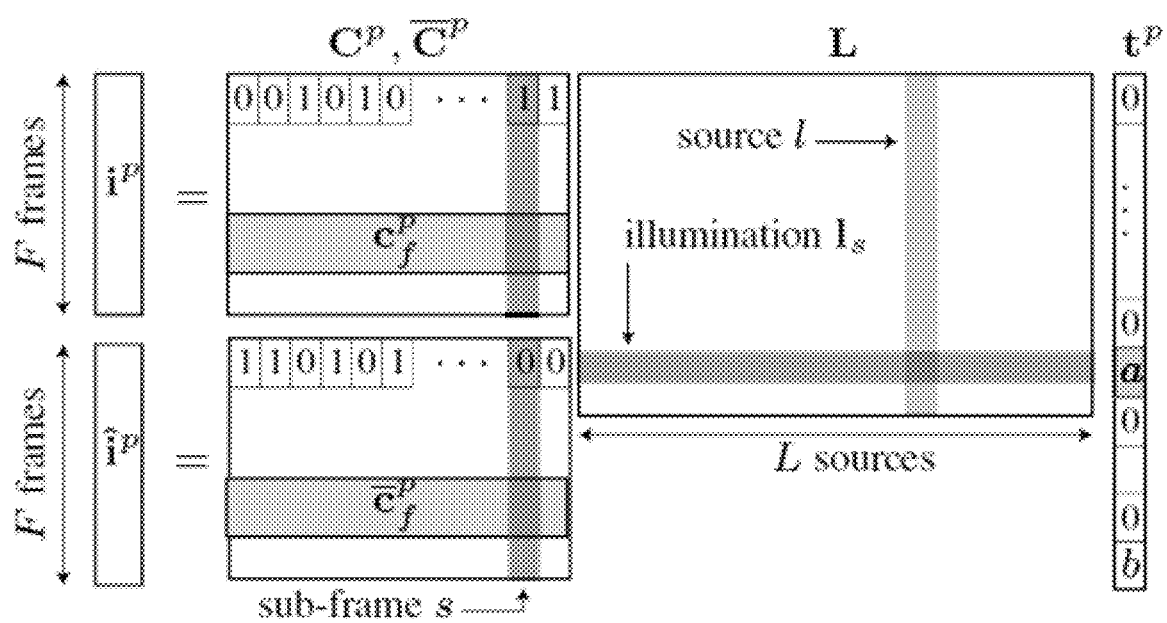
FIG. 22 is an example diagram of a result of light transport to two buckets for the system of FIG. 1.

For two-bucket image formation model for pixel p, let $i^p$ and $\hat{i}^p$ be column vectors holding the intensity of bucket 1 and bucket 0 associated with pixel p, respectively, in F frames. This intensity is modelled as the result of light transport from the L light sources to the two buckets associated with the pixel; as diagrammatically illustrated in FIG. 22.

$$\underbrace{\begin{bmatrix} i^p \\ \hat{i}^p \end{bmatrix}}_{2f \times 1} = \underbrace{\begin{bmatrix} C^p \\ \overline{C}^p \end{bmatrix}}_{2f \times s} \underbrace{L}_{s \times l} \underbrace{t^p}_{l \times 1}$$

where $\overline{b}$ denotes the binary complement of matrix or vector b, $C^p$ is the slice of the code matrix corresponding to p, and $t^p$ is the pixel's transport vector. Element $t^p[l]$ of this vector specifies the fraction of light source l's intensity that is transported to pixel p in the timespan of one sub-frame, across all light paths and across both buckets.

To gain some intuition about the above equation, consider the buckets' intensity in frame f:

$$i^p[f] = \underbrace{(c_f^p l)}_{\substack{\text{illumination condition} \\ \text{of pixel p, bucket 1, frame f}}} t^p$$

$$\hat{i}^p[f] = \underbrace{(\overline{c}_f^p l)}_{\substack{\text{illumination condition} \\ \text{of pixel p, bucket 0, frame f}}} t^p$$

In effect, the two buckets associated with pixel p can be thought of as "viewing" the scene under two potentially different illumination conditions given by the vectors $c^p L$ and $\overline{c}^p L$, respectively. Moreover, if $c_f^p$ varies from frame to frame these illumination conditions will vary as well.

For the bucket-1 and bucket-0 image sequences, collecting the two buckets' intensities across all frames and pixels, two F×P matrices are defined that hold this data:

$$I = [i^1 \; i^2 \; \ldots \; i^P] \quad \hat{I} = [\hat{i}^1 \; \hat{i}^2 \; \ldots \; \hat{i}^P]$$

The sequences I and $\hat{I}$ can be used as input to recover per-pixel geometry (depth, normals, or both) from multiple intensity measurements at each pixel.

Using the embodiments described herein, solutions to the technical problem of normal and depth estimation using photometric stereo and structured light stereo can be implemented. As described below, these tasks are implemented using determinations that are advantageously done independently at each pixel, and the relation between observations and unknowns is generally expressed as a system of linear equations. The determinations described herein are merely examples that illustrate special characteristics of two-bucket imaging; however, using advanced approaches to handle more general settings is also possible.

For two-bucket constraints from a single frame, shape constraints are provided by a pixel's associated two buckets. For notational simplicity, the pixel and frame indices are dropped, and instead, the intensity of each bucket is denoted with scalars i and $\hat{i}$, respectively, and the illumination condition of each bucket is denoted with vectors $I=c^p_f L$ and $\hat{I}=\overline{c}^p_f L$, respectively.

The relation between intensity and the pixel's unknowns can take the same form in both photometric stereo and structured light triangulation with cosine patterns, via the following relationship equations:

$$i = a\mathbf{I}Dx + e \quad \hat{i} = a\hat{\mathbf{I}}Dx + \hat{e}$$

where I, $\hat{I}$, D are all known. D is representative of lighting conditions, x is a 3D vector that contains the pixel-specific unknowns; a is an unknown scalar; and e, $\hat{e}$ are observation noise. See the TABLE 1 below for a summary of the assumptions pertaining to each problem and for the mapping of each problem's quantities to the factors in the above relationship equations.

TABLE 1

| | Lambertian photometric stereo | Structured-light triangulation w/cosine patterns |
|---|---|---|
| Assumptions | Lambertian reflectance, non-uniform albedo; calibrated light sources; no ambient or indirect light | reflectance has non-negligible diffuse component; robustness to indirect light depends on frequency choice |

TABLE 1-continued

|  | Lambertian photometric stereo | Structured-light triangulation w/cosine patterns |
| --- | --- | --- |
| Illumination vectors: $l_l$ | each $l_l$ corresponds to illumination with only source l turned on, i.e., element $l_l[k]$ non-zero iff l = k | $l_l[k] = \cos(\theta_l + k\phi_l)$, where $(\theta_l, \phi_l)$ given by the frequency and phase shift of l-th projection pattern |
| Transport vector t | t = aDn, where n is the 3 × 1 unit surface normal and a is the Lambertian albedo | t = aD[s' b]', is where a is a reflectance factor, b is the contribution of ambient light, and binary vector s indicates the matching projector pixel, i.e., s[k] = 1 iff that pixel is k (see FIG. 5b) |
| Matrix D | row l of D is a 3D vector that represents the unit orientation and intensity of the l-th light source | row l of D is the vector $[\cos(\theta_l)\text{-}\sin(\theta_l)1]$ |
| Vector x | x = n | $x = [\cos(k\phi_l) \sin(k\phi_l)b]'$ if same cosine frequency used for all patterns; additional frequencies contribute two unknowns each |

There are at least three ways to turn the above relationship equations into a constraint on normals and depths, under the assumption of zero-mean normally-distributed noise.

In a first way, using a direct approach, the above relationship equations are treated as two independent constraints on vector ax, then solving for both a and x once enough constraints are available. The advantage of this approach is that errors are normally distributed by construction. A disadvantage may be that the above relationship equations depend on albedo (or reflectance). The above relationship equations may also make single-frame shape estimation harder when a varies from pixel to pixel.

In a second way, using a bucket-ratio (BR) constraint approach, since the two buckets represent different illumination conditions, their ratio can be an illumination ratio. This yields a constraint over x:

$\hat{r}\text{1D}x = \text{ID}x$, where $\hat{r} = \hat{i}/\hat{i}$.

The bucket ratio r is well approximated by a Gaussian random variable whose mean is the ideal (noiseless) bucket ratio and its standard deviation depends weakly on a. Specifically, under typical signal-to-noise ratio conditions, i's standard deviation is equal to $\sigma/i_n$, where $i_n$ is the noiseless bucket-1 intensity and $\sigma$ is the standard deviation of noise. In effect, two-bucket imaging provides one "reflectance-invariant" image per frame.

In a third way, using a bucket cross-product (BCP) constraint approach, instead of computing an explicit ratio from the above relationship equation, a can be eliminated to obtain:

$i\hat{\text{1}}Dx = \hat{i}\text{1D}x$

Since the above equation has intensities i, $\hat{i}$ as factors, it implicitly depends on albedo.

In the first way, at least three independent DM constraints are required to solve for the 3D vector ax. This solving can be accomplished by singular-value decomposition. In the second and third way, given at least two independent bucket-ratio (BR) or bucket cross-product (BCP) constraints, x can be determined by solving the generalized eigenvalue problem they form.

The above approaches provide ways to solve for 3D shape when there are enough independent constraints per pixel. In the following, there is provided a solution to the problem of capturing a sequence of frames that provides constraints for a pixel p. In particular, selecting (1) the number of frames F, (2) the number of sub-frames per frame S, and (3) the pixel-specific slice of the F×S code matrix, $C^p$. Determining these parameters can be thought of as an instance of an optimal multiplexing problem. This problem deals with one-to-one mapping from F desired measurements to F actual, noisy observations. In the case of coded two-bucket imaging, the problem is unique because each frame yields two measurements instead of just one.

As a starting point, we expand:

$$\begin{bmatrix} i^p \\ \hat{i}^p \end{bmatrix} = \begin{bmatrix} C^p \\ \overline{C}^p \end{bmatrix} Lt^p$$

to get a relation that involves only intensities:

$$\underbrace{\begin{bmatrix} i^p \\ \hat{i}^p \end{bmatrix}}_{\substack{\text{bucket measurements} \\ (2F \times 1)}} = \begin{bmatrix} C^p \\ \overline{C}^p \end{bmatrix} \begin{bmatrix} l_1 t^p \\ \vdots \\ l_S t^p \end{bmatrix} \stackrel{def}{=} \underbrace{\begin{bmatrix} C^p \\ \overline{C}^p \end{bmatrix}}_{\substack{\text{bucket-multiplexing} \\ \text{matrix W} \\ (2F \times S)}} \underbrace{\begin{bmatrix} i_1^p \\ \vdots \\ i_L^p \end{bmatrix}}_{\substack{\text{pixel intensity under} \\ \text{illuminations } l_1, \ldots, l_S \\ (S \times 1)}}$$

Each scalar $i_s^p$ in the above equation is an intensity that a conventional camera pixel would have if the scene's illumination condition was $l_s$. The above equation indicates that, as far as a single pixel p is concerned, coded two-bucket imaging multiplexes S desired intensity measurements into the pixel's two buckets across F frames.

With this approach, even though a pixel's two buckets provide 2F measurements in total, generally at most F+1 of them can be independent because the multiplexing matrix W is rank-deficient:

rank $W = \min(F+1, S)$.

As a note, the C2B camera is generally not equivalent to two coded-exposure cameras that operate completely independently from each other. This is because the masking that controls bucket activity is complementary, and thus not independent. It follows that out of the 2F intensities captured by a pixel's buckets across F frames, F+1 of them provide independent constraints and the rest generally provide redundant measurements; thus, they are useful for improving performance in the presence of noise.

For finding the optimal F×(F+1) matrix $C^p$, the equation below is used to obtain a lower bound on a mean-squared error (MSE) of bucket multiplexing:

$$MSE = \frac{\sigma^2}{S} \text{trace}[(W'W)^{-1}] \geq 2\sigma^2 \frac{F^2 + 1}{F(F+1)^2}$$

where for every multiplexing matrix W, the MSE of the best unbiased linear estimator satisfies the lower bound of the above equation.

Although the above generally does not provide an explicit construction, it does ensure the optimality of matrices W whose MSE is the lower bound. This observation can be used to verify that matrices are optimal for "realistic" values of F. Let $C^p={}^1$ (H+1) where H is derived from the (F+1)× (F+1) Hadamard matrix by removing its row of ones to create an F×(F+1) matrix. The bucket-multiplexing matrix W defined by $C^p$ is optimal for F≤10000 when (F+1), (F+1)/12, or (F+1)/20 is a power of two. The shortest sequences for which the above applies are F=3 and F=7. Since a primary goal is one-shot acquisition, optimal matrices for other small values of F are also of interest. To find them, a brute-force search over the space of small F×(F+1) binary matrices can be used to find the ones with the lowest MSE. These matrices are shown in TABLE 2 below.

TABLE 2

| # Frames | F = 2 | F = 3 | F = 4 | F = 5 | F = 6 |
|---|---|---|---|---|---|
| MSE Eq. bound for σ = 1 | 1.25 | 1.66666 | 1.41667 | 1.73333 | 1.54167 |
| Optimal MSE for σ = 1 | 2.5 | 1.66666 | 1.88889 | 3.4 | 2.27778 |
| Optimal $C^p$ | 1 0 0 | 1 1 0 0 | 1 1 0 0 0 | 1 1 0 1 0 0 1 1 1 0 0 0 0 |
|  | 0 1 0 | 1 0 1 0 | 1 0 1 0 0 | 1 1 0 0 1 0 1 0 0 0 1 1 0 |
|  |  | 1 0 0 1 | 1 0 0 1 0 | 1 0 1 0 1 0 1 0 0 0 0 0 1 1 |
|  |  |  | 1 0 0 0 1 | 1 0 1 0 0 1 0 1 1 0 0 1 0 |
|  |  |  |  | 1 0 0 1 0 1 1 0 1 0 1 0 1 |
|  |  |  |  | 0 0 1 0 1 0 1 |

A technical advantage of C2B cameras, using system 100, is that they can offer an alternative to multi-frame acquisition: instead of capturing many frames in sequence, they can capture a spatially multiplexed version of them in a single frame. Such a frame is referred to as a two-bucket illumination mosaic; an analogy to RGB filter mosaics of conventional color sensors.

Figure 23:
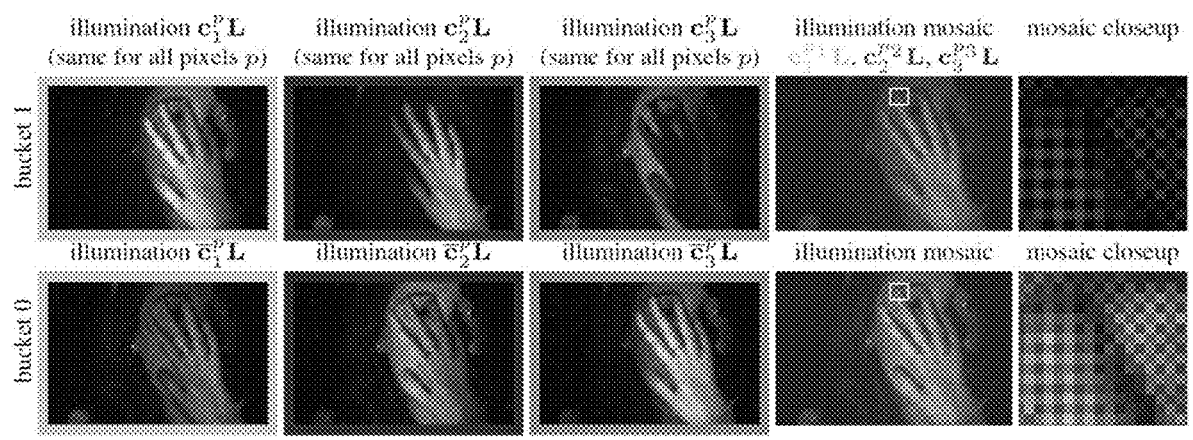
FIG. 23 is an example illustration of images captured and mosaics determined in accordance with the system of FIG. 1.

Similar to an RGB mosaic, full image sequences I and Î are sampled at 1/F of the image sensor's 110 resolution. To compute a 3D shape at full resolution, the illumination mosaic can be upsampled using image demosaicing techniques and then the techniques described herein can be applied to every pixel independently. Unlike color filter mosaics, which are attached to color sensors and generally cannot be changed, acquisition of illumination mosaics in the present embodiments is fully programmable for any F. In a particular case, to maximize shape resolution, acquisition of the densest possible mosaics is considered; those that multiplex F=3 or F=2 frames into one shot. This is illustrated in FIG. 23. Frames in the first three columns were captured using a three-frame code matrix C. This matrix assigned illumination conditions that where the same for all pixels in a frame but different across frames. The fourth column shows an illumination mosaic, captured in one shot, that multiplexes the frames on the left using a 3-pixel tile on the rightmost images.

Acquiring an illumination mosaic amounts to specifying a one-frame code matrix $\tilde{C}$ that spatially multiplexes the corresponding F frame matrix C. This is accomplished by (1) defining a regular F-pixel tiling of the sensor plane and (2) specifying a one-to-one correspondence $(p_i, f_i)$, 1≤i≤F, between pixels in a tile and frames. The columns of $\tilde{C}$ are then defined to be:

$$\tilde{c}_1^{p_i} \stackrel{def}{=} c_{f_i}^{p_i}$$

In a particular case, there are three different ways of applying the shape estimation approaches described above to the 2P intensities of an illumination mosaic.

In a first way, using intensity demosaicing (ID), an intensity of each bucket of each pixel in a tile is treated as a separate "color channel" for the purposes of demosaicing. These intensities are upsampled by applying an RGB demosaicing approach to three of these 2F channels at a time. Then applying any of the shape estimation approaches described above to the result.

In a second way, using bucket-ratio demosaicing (BRD), also called collection node-ratio demosaicing, a bucket ratio at each pixel is determined to turn intensity measurements into albedo/reflectance-invariant measurements. The ratio of each pixel in a tile is treated as a separate "color channel" for the purpose of demosaicing. The shape is determined using the bucket-ratio constraint of:

$$r\hat{\text{I}}\text{D}x=\text{ID}x, \text{ where } r=\hat{i}/i$$

In a third way, using no demosaicing (ND), instead of upsampling, each tile is treated as a "super-pixel" whose shape unknowns (such as, normal, albedo, disparity, and the like) do not vary from pixel to pixel. One shape estimate per tile is determined using any of the approaches described herein. Unlike the other two ways, which yield per-pixel shape estimates, this way returns 1/F fewer estimates.

Figure 24A:
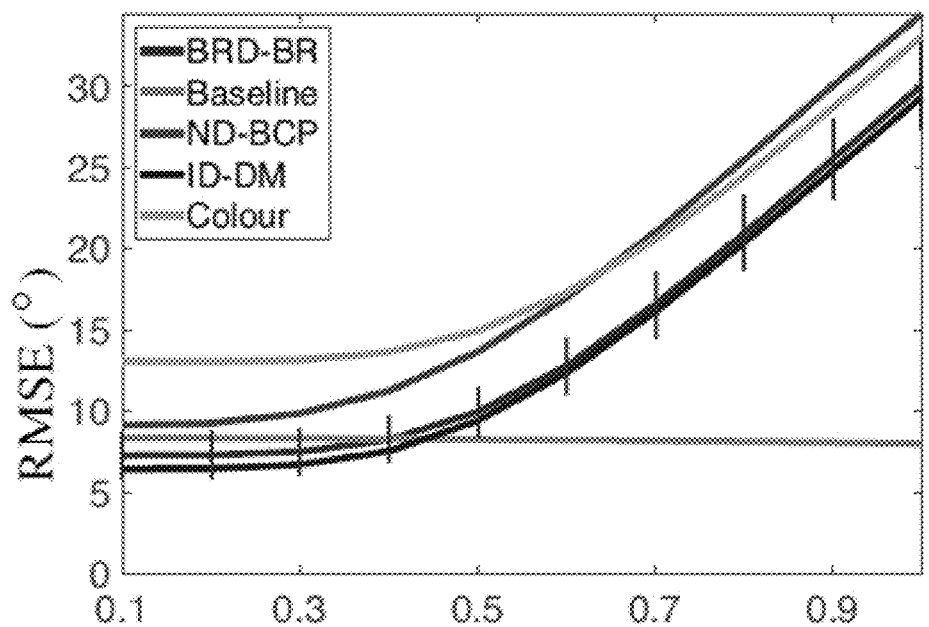
FIG. 24A is a chart comparing several combinations of approaches in accordance with the system of FIG. 1.
Figure 24B:
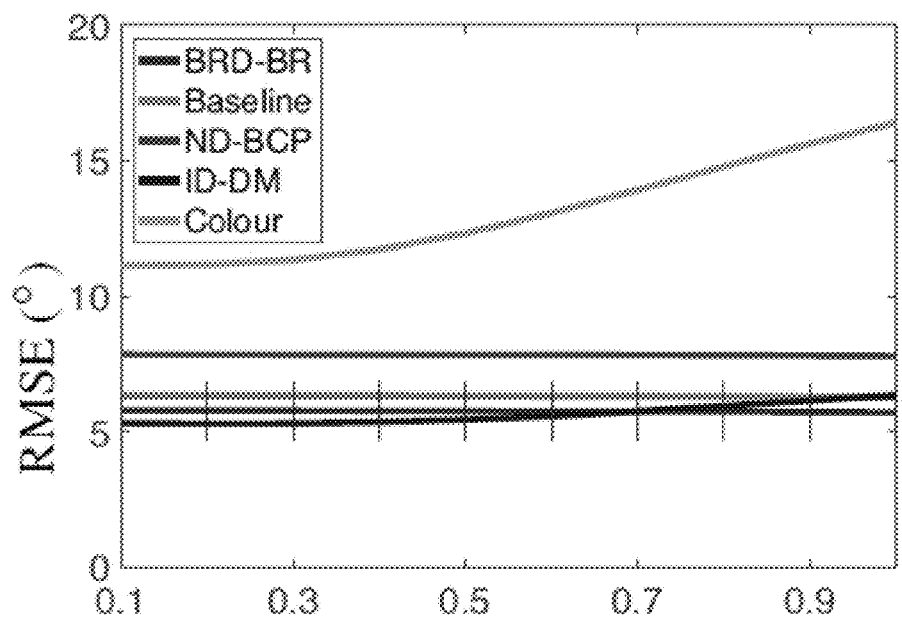
FIG. 24B is a chart comparing a baseline 3-frame approach and a color photometric stereo approach considering the effect of spatial albedo variations in accordance with the system of FIG. 1.

The Applicant evaluated the performance of the C2B camera described herein on synthetic data. The effective resolution and albedo invariance of normals computed from photometric stereo was determined by (1) applying them to synthetically-generated scenes with spatially varying normals and albedo, and noisy images, and (2) evaluating reconstruction performance against their spatial frequency content. Since all determinations, except demosaicing, are done per pixel, any frequency-dependent variations in performance are due to these steps. FIG. 24A is a chart that compares several combinations of the approaches described herein. They are also compared against a baseline 3-frame method that processes full-resolution images, and a color photometric stereo approach. As determined, the C2B camera's data has better performance than the color-based photometric stereo approach. FIG. 24B is a chart that considers the effect of spatial albedo variations. Both comparisons in FIGS. 24A and 24B match intuition; i.e., that performance does degrade for very high albedo frequencies regardless of the type of neighborhood processing. Generally, for peak signal-to-noise ratio (PSNR) of at least 30, the C2B cameras confer a substantial performance advantage for scenes with spatial frequencies up to one-third the Nyquist limit.

In the Applicant's exemplary experiments, the experimental setup consisted of a C2B camera, a Texas Instruments LightCrafter DMD projector and 4 LEDs. The camera was able to operate at 16-20 FPS with up to 4 subframes per frame. This allows the running of Photometric Stereo and capturing the data at near video speeds.

Figure 26:
FIG. 26 is a photo of the scene used for the results of FIGS. 25A and 25B.

To perform ground-truth acquisition, a static scene was created consisting of a hat which had colourful bands and textures as well as of a book which occludes part of the hat, shown in FIG. 26. This scene was chosen because traditionally, one-shot methods have relied on color cues to infer the appearance of the scene under different lighting conditions. This allows the evaluation of how well shape estimation works under challenging conditions. The objects were placed 2 m away from the camera. A 23 mm lens was mounted on the camera, providing a field of view of about 30 cm by 30 cm. In both cases, 1000 images were captured for each illumination condition to reduce the noise. The ground truth data was compared to BRD-BR, ID-DM, and ID-DM with one bucket.

Figure 25A:
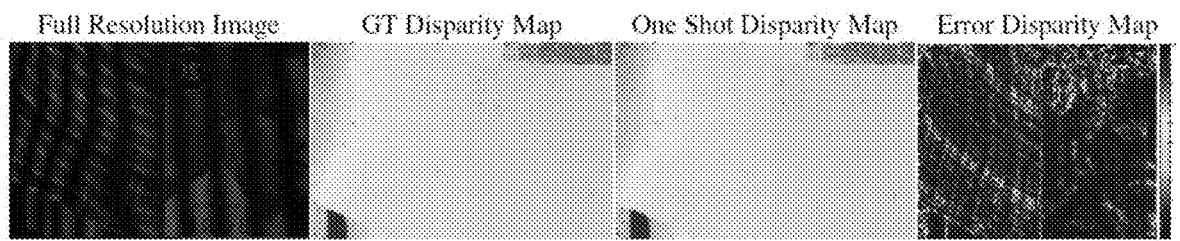
FIG. 25A is a visualization of exemplary results of the system of FIG. 1 used for structured light.

For real objects using structured light, ground truth disparity estimation was captured by illuminating the object with 4 phase-shifted sinusoidal patterns of frequency 1 and 3 phase-shifted quantized sinusoidal patterns of frequency 16. The projector was placed 60 cm away from the object with a baseline of 1.5 m. The low frequency information was used to perform phase unwrapping and the higher frequency quantized sinusoids as ground truth. Three patterns were used for the single shot acquisition. The results are visualized in FIG. 25A, where for structured light, BRD-BR yielded the best response with an RMSE of 2.7 after outliers are removed. Since all the outliers cannot be removed, an RMSE of 4.7 was reported when the outliers were kept. Since the projector has 608 columns and a frequency of 16 was used, the maximum error possible is 608/16=38. Hence, there was an accuracy of about 5-10% of maximum error. Since quantized sinusoids were used, this value provides a lower bound on the performance of the C2B camera.

Figure 25B:
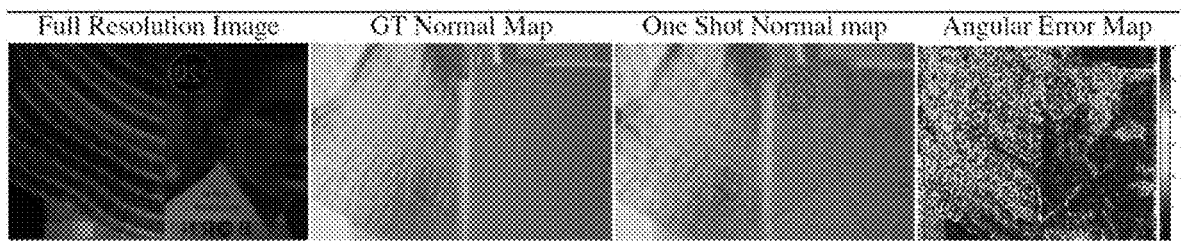
FIG. 25B is a visualization of exemplary results of the system of FIG. 1 used for photometric stereo light.

For real objects using photometric stereo, a direction of each light source was calibrated using a chrome sphere placed 2 m from the camera and lights being 2-3 m from the scene. An image was captured using 4 subframes, one for each light source, to capture the sequence. The results are also visualized in FIG. 25B, and ID-DM was found to perform the best for photometric stereo with an RMS angular error of 10.695° and a median angular error of 5.63°. However, the RMSE for ND-DM is still quite high over 10°. This may be explained by the non-uniform gain that is applied to each mask. This means that in the least squares optimization B=AX, a skew to A is being applied.

The results support the fact that 3D measurements can be advantageously obtained using C2B cameras at, or close to, sensor resolution.

Figure 34:
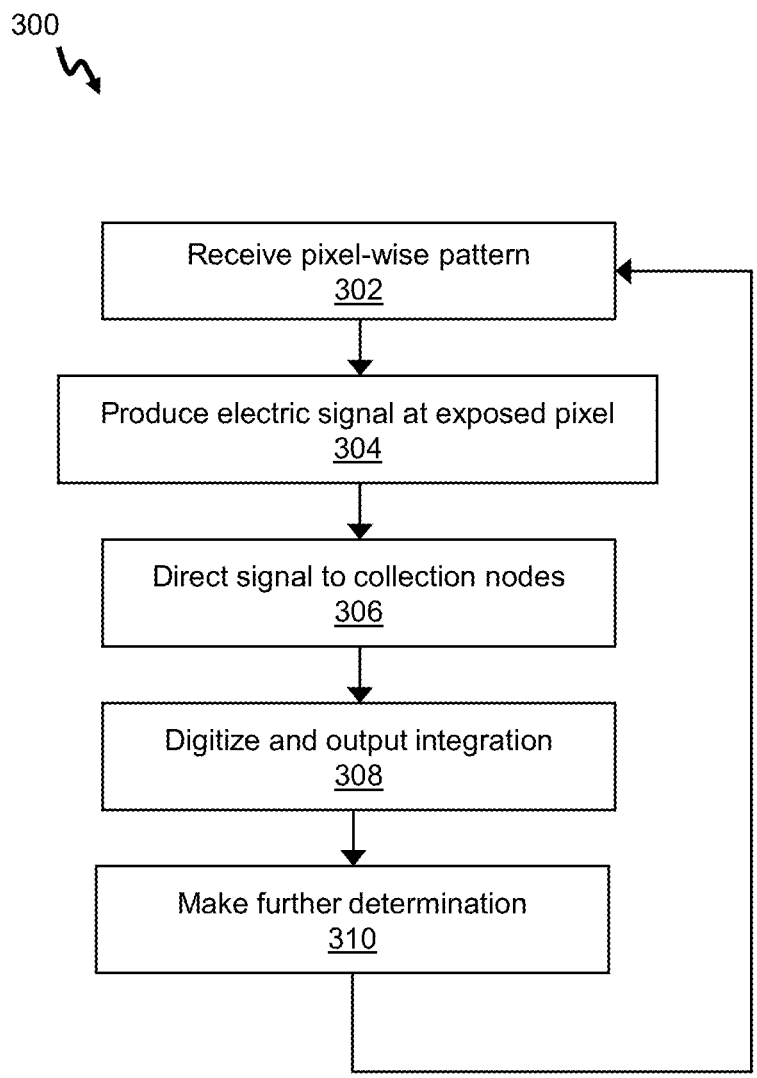
FIG. 34 is a flowchart showing a method for pixel-wise imaging of a scene, in accordance with an embodiment.
Figure 35A:
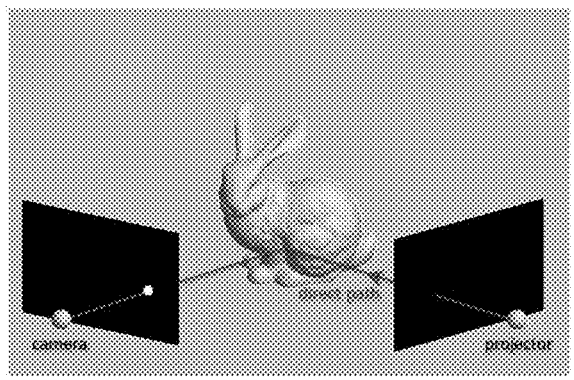
FIG. 35A is an exemplary illustration showing projecting and receiving a direct light path on a scene.
Figure 35B:
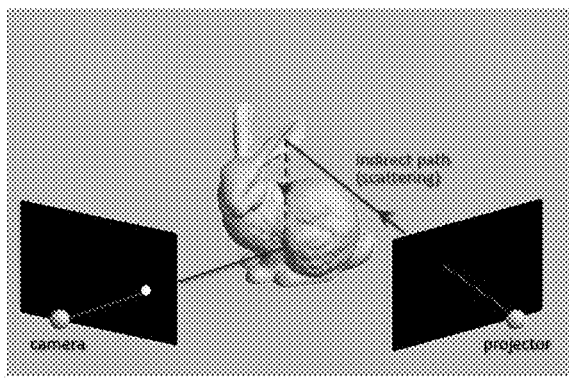
FIG. 35B is an exemplary illustration showing projecting and receiving an indirect light path on the scene of FIG. 35A.
Figure 35C:
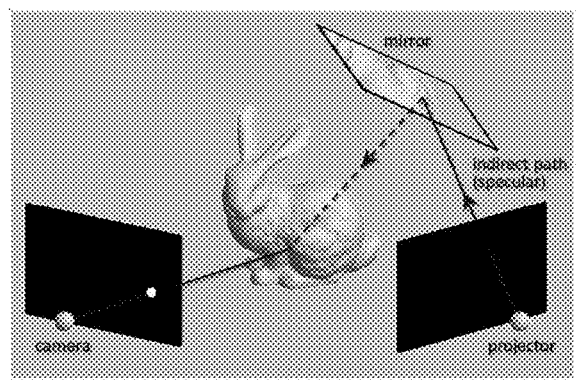
FIG. 35C is an exemplary illustration showing projecting and receiving a specular light path on the scene of FIG. 35A.
Figure 35D:
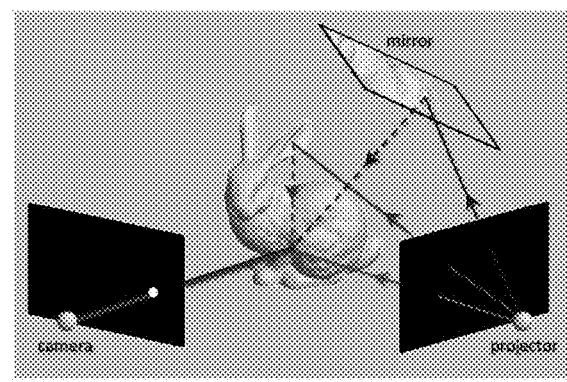
FIG. 35D is an exemplary illustration showing projecting and receiving multiple different types of light paths on the scene of FIG. 35A.

FIG. 34 illustrates a method 300 for pixel-wise imaging of a scene, in accordance with an embodiment. At block 302, the control logic module 112 receives a pixel-wise pattern, the pixel-wise pattern comprising a masking value for each pixel in an array of pixels of the image sensor 110. At block 304, each pixel of the image sensor 110 producing an electronic signal when such pixel is exposed to light received from the scene. At block 306, the control logic module 112 directs the electronic signal at each pixel to a one or more collection nodes in the signal storage module 114, associated with such pixel, based on the respective masking value. The one or more collection nodes each capable of integrating the received electronic signal. In some cases, as described herein, only one, or some, of the collection nodes receive the signal.

In some cases, at block 308, the digitization module 116 can digitize and output a measure of the integration at each collection node.

In some cases, at block 310, a processor 102 can make further determinations based on the integrated values at each of the collection nodes; for example, a time-of-flight determination, a determination of light path type (direct, indirect, or specular), depth, normals, or the like.

Although the invention has been described with reference to certain specific embodiments, various modifications thereof will be apparent to those skilled in the art without departing from the spirit and scope of the invention as outlined in the claims appended hereto. The entire disclosures of all references recited above are incorporated herein by reference.

The invention claimed is:

1. A system for imaging of a scene, the system comprising:
    an image sensor comprising an array of pixels, each pixel comprising a photosensitive receptor that produces an electronic signal when exposed to light received from the scene;
    a signal storage module comprising one or more collection nodes, each collection node capable of integrating the electronic signal received by it; and
    a control logic module for receiving a pattern and directing the electronic signal to one or more of the respective collection nodes based on the pattern, wherein the pattern is received for every subframe, and the electronic signal is directed based on the pattern, each frame comprising a plurality of subframes.

2. The system of claim 1, wherein the control logic module comprises a first memory unit and a second memory unit, the second memory unit storing the pattern for a current subframe and the first memory unit storing the pattern for an upcoming subframe, wherein the pattern for the upcoming subframe is loaded into the first memory sequentially, and the pattern for the current subframe is stored in the second memory for pipelined operation.

3. The system of claim 1, wherein the light received from the scene comprises temporally modulated light from a light source and the one or more collection nodes comprises exactly two collection nodes for each pixel, the system further comprising a processor to determine time-of-flight of the modulated light by measuring phase differences between the modulated light at the light source and the light received at the photosensitive receptor, the electronic signal directed to one of the collection nodes during a first portion of the modulation of the modulated light and the electronic signal directed to the other collection node during a second portion of the modulation of the modulated light, wherein for each subframe the pattern is used to determine whether the signal is to be demodulated by means of the said demodulation process or the signal is to be discarded.

4. The system of claim 1, the system further comprising one or more light sources to project a light-pattern onto the scene, and the pattern received by the control logic module directs the electronic signal to one of the collection nodes if the light received at the respective pixel approximately corresponds to one of more of predetermined light path types associated with that node, wherein the predetermined light path type comprises one of a direct light path, an indirect light path, and a specular light path.

5. The system of claim 1, wherein the light received from the scene comprises photometric stereo light illumination conditions from one or more light sources, and the electronic signal is directed by the pattern to one of the collection nodes for each respective illumination condition, the system further comprising a processor to determine surface orientations of one or more objects in the scene based on the intensity of light received.

6. The system of claim 1, wherein the light received from the scene comprises structured light illumination conditions, and the electronic signal is directed by the pattern to one of the collection nodes for each respective illumination condition, the system further comprising a processor to determine the depth to one or more objects in the scene from the intensity of light received via triangulation with pixels at the light source and pixels at the image sensor.

7. The system of claim 1, wherein the one or more collection nodes are associated with a group of one or more pixels.

8. The system of claim 1, wherein the pattern prevents a subset of the array of pixels from registering light received from the scene by directing the control logic module to discard the electronic signal.

9. The system of claim 1, wherein the one or more collection nodes comprises, for each pixel, a first type of collection node and a second type of collection node, and wherein the pattern directs the electronic signals received from a first subset of the array of photosensitive receptors to a subset of the first type of collection nodes, and from a second subset of the array of photosensitive receptors to a subset of the second type of collection nodes.

10. The system of claim 1, wherein the one or more collection nodes comprises, for each pixel, a first type of collection node, a second type of collection node, a third type of collection node, and a fourth type of collection node, and wherein the pattern directs the electronic signals received from a first subset of the array of photosensitive receptors to a subset of the first type of collection nodes, from a second subset of the array of photosensitive receptors to a subset of the second type of collection nodes, from a third subset of the array of photosensitive receptors to a subset of the third type of collection nodes, and from a fourth subset of the array of photosensitive receptors to a subset of the fourth type of collection nodes.

11. The system of claim 10, wherein the light received from the scene comprises temporally modulated light from a light source, wherein the first type of collection node and the second type of collection node comprise a first pair of collection nodes and the third type of collection node and the fourth type of collection node comprise a second pair of collection nodes, the system further comprising a processor to determine time-of-flight of the modulated light by measuring phase differences between the modulated light at the light source and the light received at the photosensitive receptor, the electronic signal directed to one of the collection nodes in either the first pair or the second pair during a first portion of the modulation of the modulated light and the electronic signal directed to the other collection node in the same pair during a second portion of the modulation of the modulated light, wherein for each subframe the pattern directs whether the signal is demodulated in the either the first pair of collection nodes or the second pair of collection nodes, and where the collection nodes in the other pair of collection nodes act as two additional signal collection nodes.

12. The system of claim 1, wherein the control logic module comprises an electronic signal storage node to store the electronic signal generated by the photosensitive receptor during exposure of a given subframe, and wherein, subsequently, the electronic signal stored in the electronic signal storage node is directed to one or more of the respective collection nodes based on the pattern.

13. The system of claim 1, wherein the control logic module further comprises a memory unit to load and store the pattern.

14. A method for imaging of a scene, the method comprising:
receiving a pattern;
receiving electronic signals from an array of photosensitive receptors when such photosensitive receptors are exposed to light received from the scene; and
directing the electronic signals to one or more collection nodes based on the pattern, wherein the pattern is received for every subframe, and the electronic signals are directed based on the pattern, each frame comprising a plurality of subframes.

15. The method of claim 14, wherein the light received from the scene comprises temporally modulated light and the one or more collection nodes comprises exactly two collection nodes for each pixel, the method further comprising determining time-of-flight of the modulated light by measuring phase differences between the modulated light at the light source and the received light, and wherein directing the electronic signal comprises directing the electronic signal to one of the collection nodes during a first portion of the modulation of the modulated light and directing the electronic signal to the other collection node during a second portion of the modulation of the modulated light, wherein for each subframe the pattern is used to determine whether the signal is demodulated by means of the said demodulation process or the signal is discarded.

16. The method of claim 14, wherein, the method further comprising projecting a light-pattern onto the scene, and the pattern received by the control logic module directing the electronic signal to one of the collection nodes if the light received at the respective pixel approximately corresponds to one or more of predetermined light path types associated with that node, wherein the predetermined light path type is selected from a group comprises one of consisting of a direct light path, an indirect light path, and a specular light path.

17. The method of claim 10, wherein the light received from the scene comprises photometric stereo light illumination conditions from one or more light sources, and the electronic signal is directed by the pattern to one of the collection nodes for each respective illumination condition, the method further comprising determining surface orientations of one or more objects in the scene based on intensity of light received.

18. The method of claim 14, wherein the light received from the scene comprises structured light illumination conditions, and the electronic signal is directed by the pattern to one of the collection nodes for each respective illumination condition, the method further comprising determining depth to one or more objects in the scene from intensity of light received via triangulation with pixels at the light source and pixels at the image sensor.

19. The method of claim 14, wherein each of the one or more collection nodes receive electronic signals associated with a group of one or more pixels.

20. The method of claim 14, wherein the pattern prevents a subset of the array of pixels from registering light received from the scene.

21. The method of claim 14, wherein the one or more collection nodes comprises, for each pixel, a first type of collection node and a second type of collection node, and wherein the pattern directs the electronic signals received from a first subset of the array of photosensitive receptors to a subset of the first type of collection nodes, and from a second subset of the array of photosensitive receptors to a subset of the second type of collection nodes.

22. The method of claim 14, wherein the one or more collection nodes comprises, for each pixel, a first type of collection node, a second type of collection node, a third type of collection node, and a fourth type of collection node, and wherein the pattern directs the electronic signals received from a first subset of the array of photosensitive receptors to a subset of the first type of collection nodes, from a second subset of the array of photosensitive receptors to a subset of the second type of collection nodes, from a third subset of the array of photosensitive receptors to a subset of the third type of collection nodes, and from a fourth subset of the array of photosensitive receptors to a subset of the fourth type of collection nodes.

23. The method of claim 22, wherein the light received from the scene comprises temporally modulated light from a light source, wherein the first type of collection node and the second type of collection node comprise a first pair of collection nodes and the third type of collection node and the fourth type of collection node comprise a second pair of collection nodes, the system further comprising a processor to determine time-of-flight of the modulated light by measuring phase differences between the modulated light at the light source and the light received at the photosensitive receptor, the electronic signal directed to one of the collection nodes in either the first pair or the second pair during a first portion of the modulation of the modulated light and the electronic signal directed to the other collection node in the same pair during a second portion of the modulation of the modulated light, wherein for each subframe the pattern directs whether the signal is demodulated in the first pair of collection nodes or the second pair of collection nodes, and where the collection nodes in the other pair of collection nodes act as two additional signal collection nodes.

\* \* \* \* \*